United States Patent
Ohi et al.

(10) Patent No.: US 6,906,574 B2
(45) Date of Patent: Jun. 14, 2005

(54) DRIVE CIRCUIT FOR DRIVING POWER SEMICONDUCTOR DEVICE

(75) Inventors: Takeshi Ohi, Tokyo (JP); Yasushi Nakayama, Tokyo (JP); Takeshi Tanaka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/627,784

(22) Filed: Jul. 28, 2003

(65) Prior Publication Data

US 2004/0027762 A1 Feb. 12, 2004

(30) Foreign Application Priority Data

Jul. 30, 2002 (JP) ........................................ 2002-221723

(51) Int. Cl.[7] .............................................. H03K 17/28
(52) U.S. Cl. ........................ 327/392; 327/394; 361/101
(58) Field of Search ................................. 327/392, 393, 327/394, 395, 398, 399, 546; 361/94, 93.1, 98, 101

(56) References Cited

U.S. PATENT DOCUMENTS

| | | | |
|---|---|---|---|
| 4,890,009 A | * 12/1989 | Miyazaki et al. | 327/108 |
| 5,210,479 A | 5/1993 | Kimura et al. | 318/727 |
| 5,383,082 A | 1/1995 | Nishizawa | 36/93.1 |
| 5,467,242 A | * 11/1995 | Kiraly | 361/94 |
| 5,710,508 A | * 1/1998 | Watanabe | 323/284 |
| 5,737,169 A | * 4/1998 | Sellers | 361/98 |
| 6,057,728 A | * 5/2000 | Igarashi | 327/546 |
| 6,717,785 B2 | * 4/2004 | Fukuda et al. | 361/93.1 |

FOREIGN PATENT DOCUMENTS

| | | |
|---|---|---|
| JP | 02-262826 | 10/1990 |
| JP | 04-165916 | 11/1992 |
| JP | 04-337919 | 11/1992 |

OTHER PUBLICATIONS

R. Chokhawala et al., "A Discussion on IGBT Short–Circuit Behavior and Fault Protection Schemes", *IEEE Trans. Ind. Applications*, 1995, pp. 256–263, 31(2).

* cited by examiner

*Primary Examiner*—Tuan T. Lam
*Assistant Examiner*—Hiep Nguyen
(74) *Attorney, Agent, or Firm*—Leydig, Voit & Mayer, Ltd.

(57) ABSTRACT

A drive circuit includes a gate voltage detector that detects a gate-emitter voltage Vge that appears between the gate and emitter of a power semiconductor device throughout a detection time period during which a sampler allows the process of detecting the gate-emitter voltage Vge, and that recognizes the occurrence of an abnormality in the power semiconductor device when the gate-emitter voltage Vge exceeds a reference value. Therefore, the drive circuit can protect the power semiconductor device with higher reliability by promptly detecting the occurrence of a short circuit even when the power semiconductor device is resistant to high voltages.

14 Claims, 18 Drawing Sheets

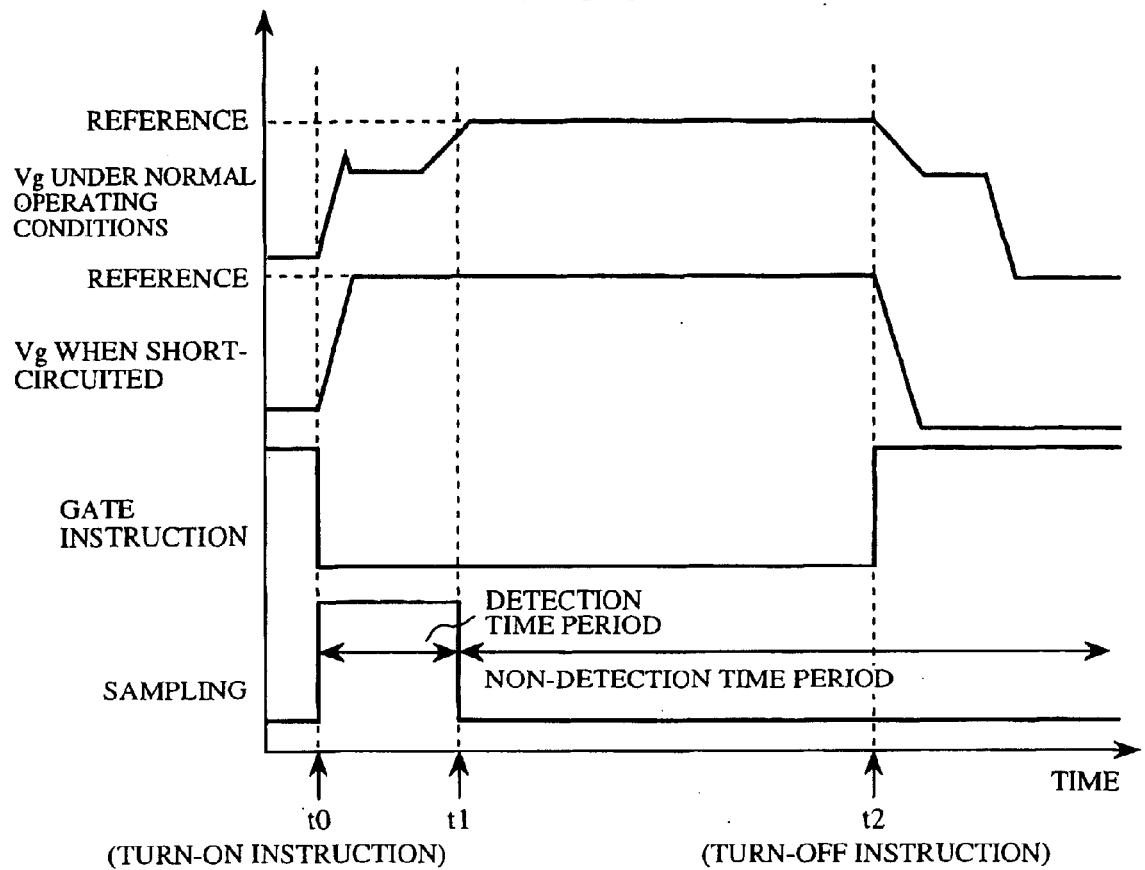
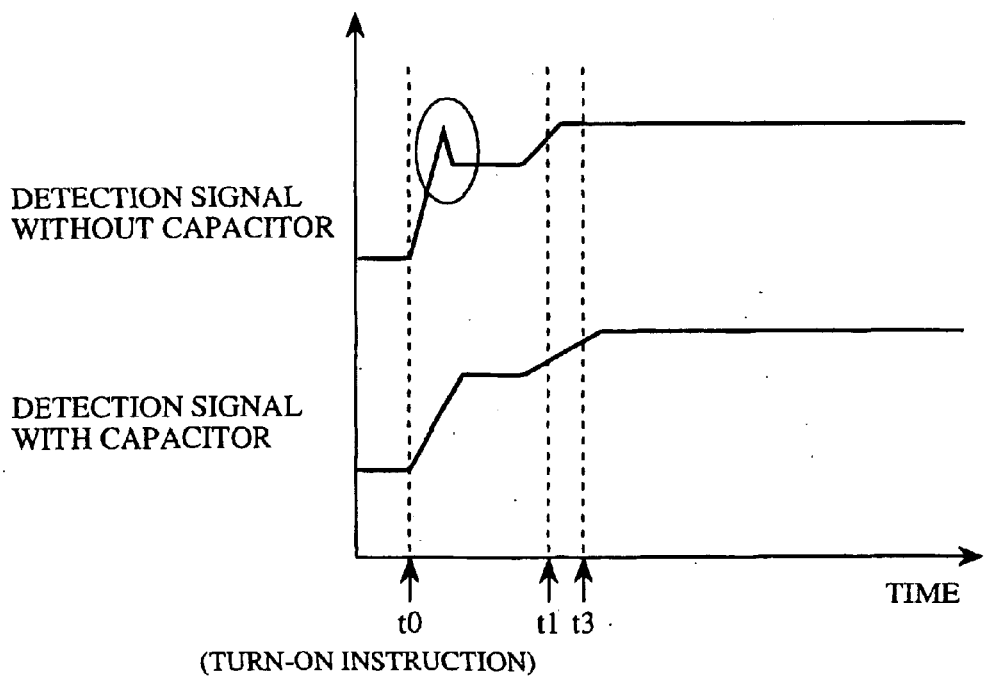

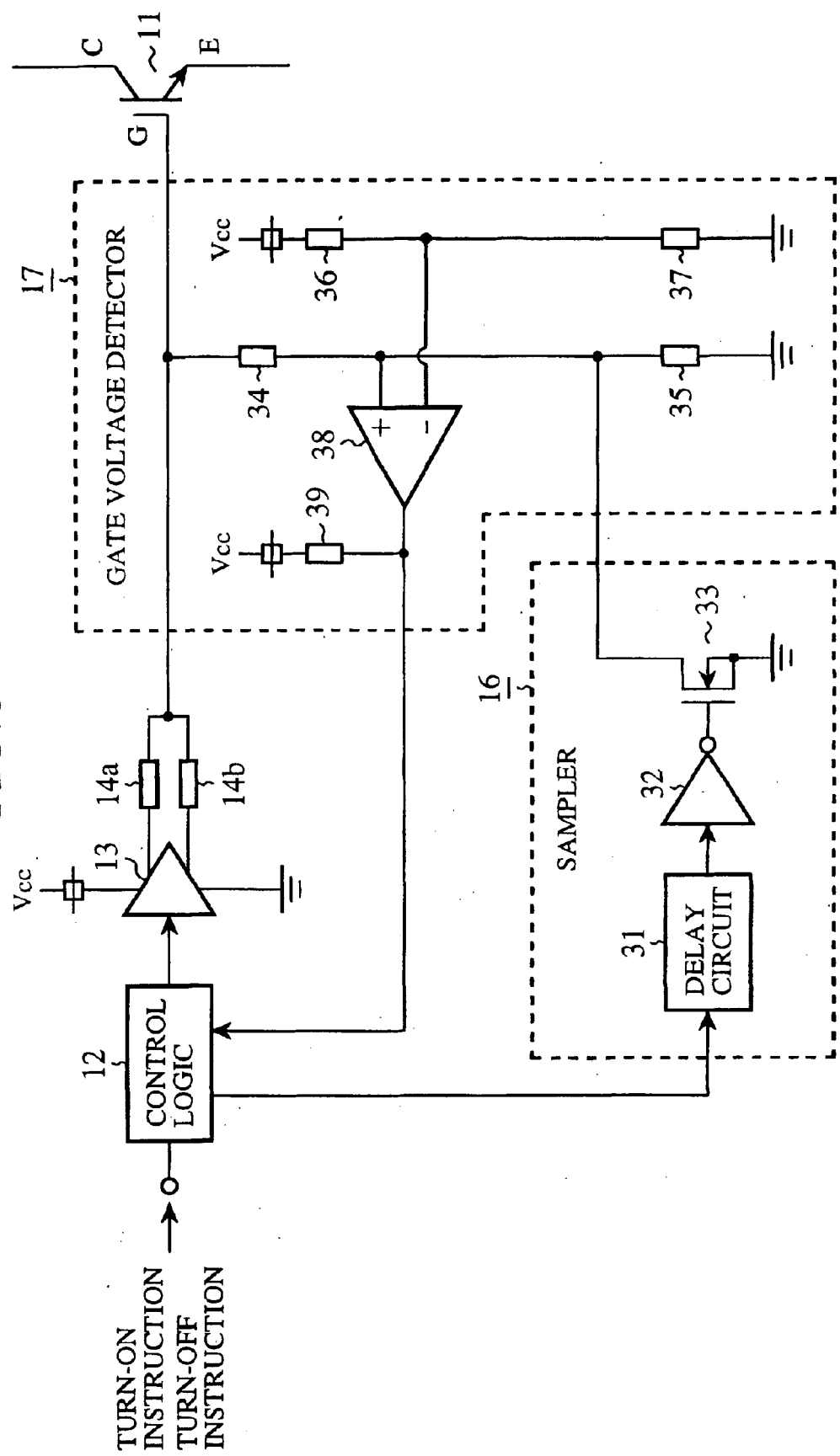

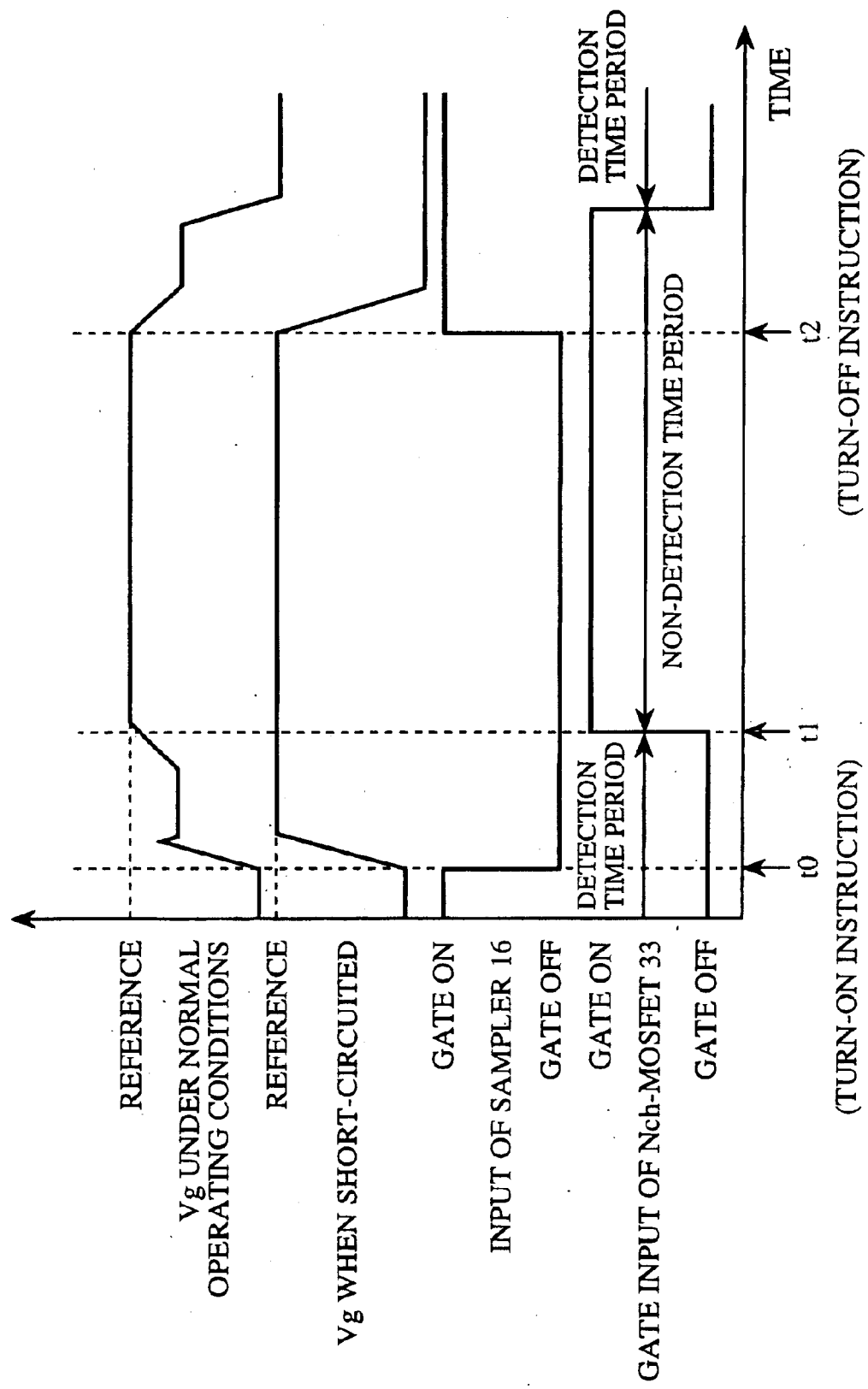

DRIVE CIRCUIT FOR DRIVING POWER SEMICONDUCTOR DEVICE

BACKGROUND OF THE INVENTION

1. Field of the Invention

The present invention relates to a drive circuit for driving a power semiconductor device and for detecting occurrence of an abnormality in the power semiconductor device.

2. Description of Related Art

FIG. 24 is a block diagram showing the structure of a prior art drive circuit for driving a power semiconductor device. In the figure, reference numeral 1 denotes an IGBT (Insulated Gate Bipolar Transistor) that is a power semiconductor device, reference numeral 2 denotes a control logic for sending a gate instruction to cause the IGBT 1 to make a transition to a closed state to a buffer 3 when receiving a turn-on instruction from outside the drive circuit, and for sending a gate instruction to cause the IGBT 1 make a transition to an open state to the buffer 3 when receiving a turn-off instruction from outside the drive circuit, reference numeral 3 denotes the buffer for driving the IGBT 1 according to the gate instruction sent thereto from the control logic 2, reference numeral 4a denotes an on-state gate resistor, reference numeral 4b denotes an off-state gate resistor, reference numeral 5 denotes a diode having a cathode connected with a collector of the IGBT 1, and an anode connected with a collector voltage detector 6, and reference numeral 6 denotes the collector voltage detector for delivering an abnormality signal to the control logic 2 when the anode of the diode 5 has a voltage larger than a reference voltage.

Next, a description will be made as to an operation of the prior art drive circuit for driving a power semiconductor device. When receiving a turn-on instruction from outside the drive circuit, the control logic 2 sends a gate instruction to cause the IGBT 1 to make a transition to a closed state (referred to as "become turned-on" from here on) to the buffer 3. When receiving the gate instruction to cause the IGBT 1 to become turned-on from the control logic 2, the buffer 3 amplifies the gate instruction and sends the amplified gate instruction to the gate of the IGBT 1 by way of the on-state gate resistor 4a. As a result, the IGBT 1 becomes turned-on.

When receiving a turn-off instruction from outside the drive circuit, the control logic 2 sends a gate instruction to cause the IGBT 1 to make a transition to an open state (referred to as "become turned-off" from here on) to the buffer 3. When receiving the gate instruction to cause the IGBT 1 to become turned-off from the control logic 2, the buffer 3 amplifies the gate instruction and sends the amplified gate instruction to the gate of the IGBT 1 by way of the off-state gate resistor 4b. As a result, the IGBT 1 becomes turned-off.

When the IGBT 1 becomes turned-on, the voltage of the collector of the IGBT 1 decreases and the diode 5 becomes turned-on. As a result, the anode of the diode 5 has a voltage equal to the sum of the on-state voltage of the IGBT 1 and the on-state voltage of the diode 5 with respect to the voltage of the emitter of the IGBT 1. When a collector current flowing in the IGBT 1 then increases, the collector voltage of the IGBT1 increases too and the anode voltage of the diode 5 increases with the increasing collector voltage of the IGBT 1. Therefore, by monitoring the anode voltage of the diode 5 within a time period during which the IGBT 1 is turned on, it is possible to detect a short circuit that can occur when a large current flows in the IGBT 1, for example, because the anode voltage of the diode 5 rises greatly.

Then, the collector voltage detector 6 monitors the anode voltage of the diode 5, and, when the anode voltage becomes larger than a reference voltage, delivers an abnormality signal to the control logic 2. When receiving the abnormality signal from the collector voltage detector 6, in order to prevent the IGBT 1 from being destroyed due to a large current flowing in the IGBT, the control logic 2 sends a gate instruction to turn off the IGBT 1 to the buffer 3 so that the buffer 3 cuts off the large current.

A problem encountered with a prior art drive circuit constructed as above for driving a power semiconductor device is that when the drive circuit is applied to a high-voltage IGBT, a number of high-voltage diodes 5 need to be connected in series and this results in an increase in the total cost of the drive circuit and a reduction in the reliability of the drive circuit. Furthermore, in a high-voltage IGBT, the collector-emitter voltage doesn't change to a steady-state value (i.e., a value acquired according to the static characteristics of the IGBT) instantaneously, but reaches the steady-state value at the expiration of a certain transition time interval after the IGBT has been turned on (according to circumstances, the collector voltage might still be tens of volts at the expiration of 10 or more microseconds after the IGBT has been turned on). Another problem is that to distinguish normal turning-on from a short circuit, the above-mentioned transition time period needs to be masked, so short-circuit detection by the collector voltage detector 6 is remarkably delayed and therefore the IGBT 1 cannot be protected.

SUMMARY OF THE INVENTION

The present invention is proposed to solve the above-mentioned problems, and it is therefore an object of the present invention to provide a high-reliability drive circuit for driving a power semiconductor device, capable of promptly detecting occurrence of a short circuit so as to protect the power semiconductor device even when applied to a high-voltage IGBT.

In accordance with the present invention, there is provided a drive circuit for driving a power semiconductor device, the circuit including a controllable variable value detection unit for detecting an amount of variable controlled by a control unit and applied to the power semiconductor device during a predetermined time period when the control unit receives a turn-on instruction, and an abnormality detection unit for monitoring the controllable variable amount detected by the controllable variable value detection unit so as to detect occurrence of an abnormality in the power semiconductor device. Therefore, the drive circuit can protect the power semiconductor device with higher reliability by promptly detecting occurrence of a short circuit even when the power semiconductor device is resistant to high voltages.

In accordance with the present invention, there is provided a drive circuit for driving a power semiconductor device, the circuit including an abnormality detection unit for monitoring a controllable variable amount detected by a controllable variable value detection unit so as to detect occurrence of an abnormality in the power semiconductor device, and for validating the detection result of the occurrence of the abnormality only during a predetermined time period after a control unit has received a turn-on instruction. Therefore, the drive circuit can protect the power semiconductor device with higher reliability by promptly detecting occurrence of a short circuit even when the power semiconductor device is resistant to high voltages.

Further objects and advantages of the present invention will be apparent from the following description of the preferred embodiments of the invention as illustrated in the accompanying drawings.

BRIEF DESCRIPTION OF THE DRAWINGS

FIG. 5 is an explanatory drawing for showing an operation sequence of the drive circuit for driving the power semiconductor device according to embodiment 1 of the present invention;

FIG. 6 is a block diagram showing the structure of a drive circuit for driving a power semiconductor device according to embodiment 2 of the present invention;

FIG. 7 is an explanatory drawing for showing an operation sequence of the drive circuit for driving the power semiconductor device according to embodiment 2 of the present invention;

FIG. 9 is an explanatory drawing for showing a gate voltage detection signal when no capacitor is connected to a dividing resistor disposed in a gate voltage detector and a gate voltage detection signal when a capacitor is connected to the dividing resistor;

DETAILED DESCRIPTION OF THE PREFERRED EMBODIMENTS

The invention will now be described with reference to the accompanying drawings.

Embodiment 1.

Figure 1:
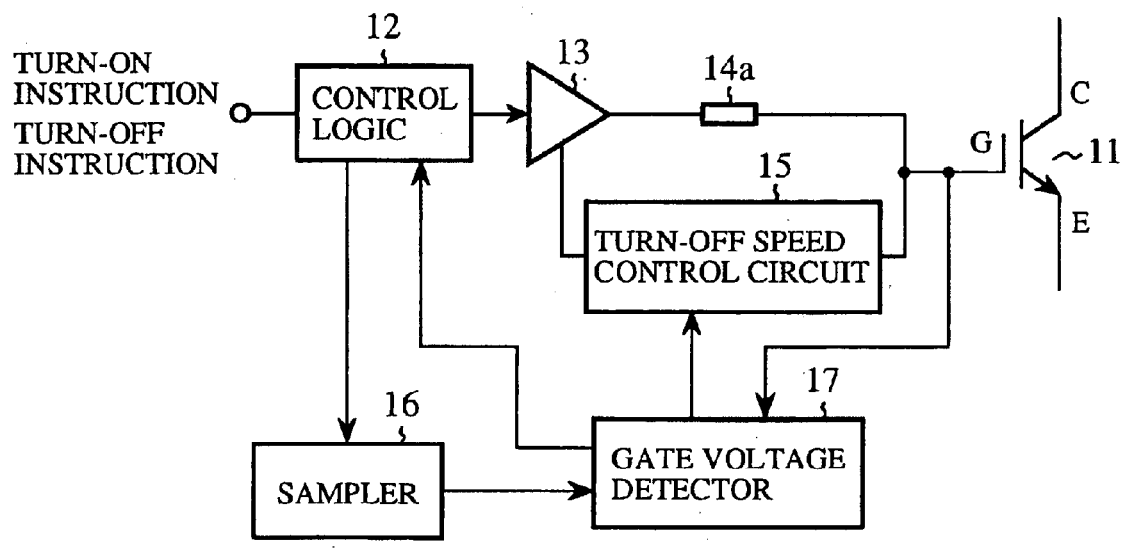
FIG. 1 is a block diagram showing the structure of a drive circuit for driving a power semiconductor device according to embodiment 1 of the present invention.

FIG. 1 is a block diagram showing the structure of a drive circuit for driving a power semiconductor device in accordance with embodiment 1 of the present invention. In the figure, reference numeral 11 denotes an IGBT (Insulated Gate Bipolar Transistor) that is the power semiconductor device driven by the drive circuit. The power semiconductor device is not limited to an IGBT and can be a voltage-driven semiconductor device such as a MOSFET, for example.

Reference numeral 12 denotes a control logic for sending a gate instruction to turn on the IGBT 11 to a buffer 13 in response to a turn-on instruction from outside the drive circuit, and for sending a gate instruction to turn off the IGBT 11 to the buffer 13 in response to a turn-off instruction from outside the drive circuit. The buffer 13 drives the IGBT 11 according to a gate instruction delivered from the control logic 12. Furthermore, reference numeral 14a denotes an on-state gate resistor, and reference numeral 15 denotes a turn-off speed adjustment circuit for, when turning off the IGBT 11 in response to a detection of occurrence of an abnormality in the power semiconductor device, turning off the IGBT 11 at a lower speed than that at which the turn-off speed adjustment circuit 15 turns off the IGBT 11 in response to a turn-off instruction. The turn-off speed control circuit 15 incorporates an off-state gate resistor. A control means is comprised of the control logic 12, the buffer 13, the on-state gate resistor 14a, and the turn-off speed control circuit 15.

Reference numeral 16 denotes a sampler (i.e., a controllable variable value detection means) for allowing a process of detecting a gate voltage Vg (i.e., a controllable voltage) that appears at a gate terminal (i.e., a control terminal) of the IGBT 11 only during a transition time period before the gate voltage Vg reaches an on-state gate voltage immediately after the control logic 12 has received a turn-on instruction from outside the drive circuit, and reference numeral 17 denotes a gate voltage detector (i.e., a controllable variable value detection means and an abnormality detection means) that detects the gate voltage Vg that appears at the gate terminal of the IGBT 11, as the controllable variable value that is applied to the IGBT 11 and is controlled by the buffer 13, throughout a time period during which the sampler 16 allows the process of detecting the gate voltage Vg, and that recognizes the occurrence of an abnormality in the IGBT 11 when the gate voltage Vg exceeds a reference value.

Figure 2:
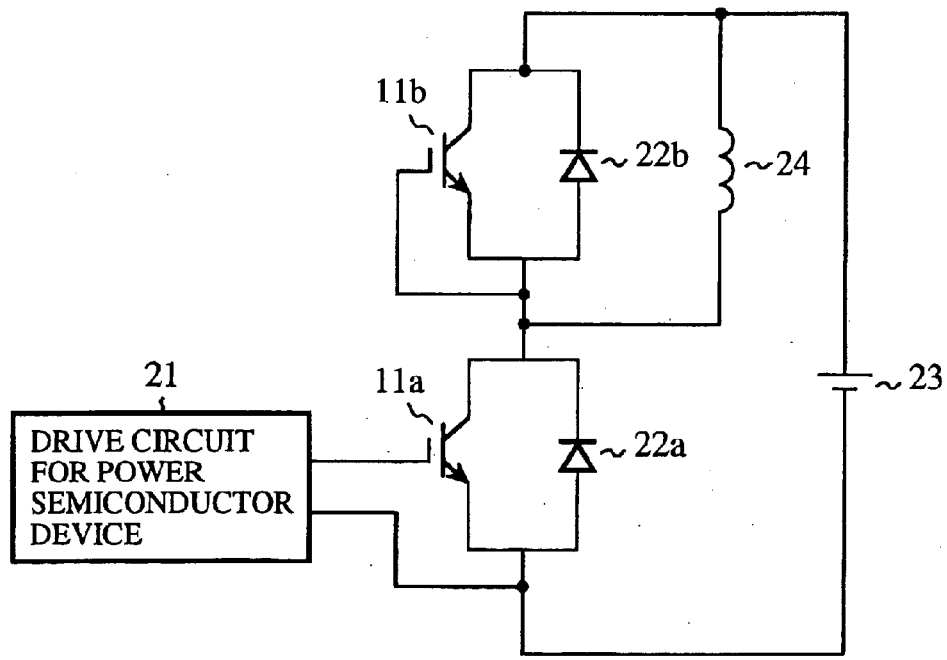
FIG. 2 is a circuit diagram showing a half bridge circuit to which the drive circuit according to embodiment 1 of the present invention is applied.

FIG. 2 is a circuit diagram showing a half-bridge circuit to which the drive circuit for driving a power semiconductor device of FIG. 1 is applied. In the figure, reference numerals 1a and 11b denote IGBTs, reference numeral 21 denotes the drive circuit, as shown in FIG. 1, for driving a power semiconductor device, reference numerals 22a and 22b denote freewheeling diodes connected reversely in parallel with the IGBTs 11a and 11b, respectively, reference numeral 23 denotes a direct-current power supply, and reference numeral 24 denotes an inductive load. Here, it is needless to say that the drive circuit for driving a power semiconductor device can be applied to another circuit other than the above-mentioned half-bridge circuit of FIG. 2.

Next, a description will be made as to an operation of the drive circuit for driving a power semiconductor device in accordance with embodiment 1 of the present invention. First of all, assume that a short circuit occurs between the gate and emitter of the IGBT 11b and the IGBT 11b is in an off state on at all times, as shown in FIG. 2. On the other hand, assume that the drive circuit 21 for driving a power semiconductor device is connected between the gate and emitter of the IGBT 11a and a gate voltage depending on a turn-on instruction or turn-off instruction is applied to the gate of the IGBT 11a.

When the IGBT 11a is turned on under normal operating conditions, an electric current flows from the direct-current power supply 23 to the IGBT 11a through the inductive load 24. On the other hand, when the IGBT 11a is turned off, the electric current supplied from the direct-current power supply 23 is cut off and the freewheeling diode 22b is turned on. As a result, a return electric current flows in a closed circuit that consists of the inductive load 24 and the freewheeling diode 22b. When the IGBT 11a is turned on again, the freewheeling diode 22b is reverse-biased, the return electric current is cut off, and the electric current flowing in the inductive load 24 commutates to the IGBT 11a.

When some factors cause the freewheeling diode 22b to become short-circuited within a time period during which the IGBT 11a is turned on, the DC power supply 23 is connected directly between the collector and emitter of the IGBT 11a and a large short-circuit current flows in the IGBT 11a, so that the collector-emitter voltage of the IGBT 11a becomes equal to the voltage of the DC power supply 23. When this state lasts for a long time, the IGBT 11a will be destroyed. The drive circuit 21 for driving a power semiconductor device is intended for high-speed detection of such a short circuit, and for safe cutoff operation.

Figure 3:
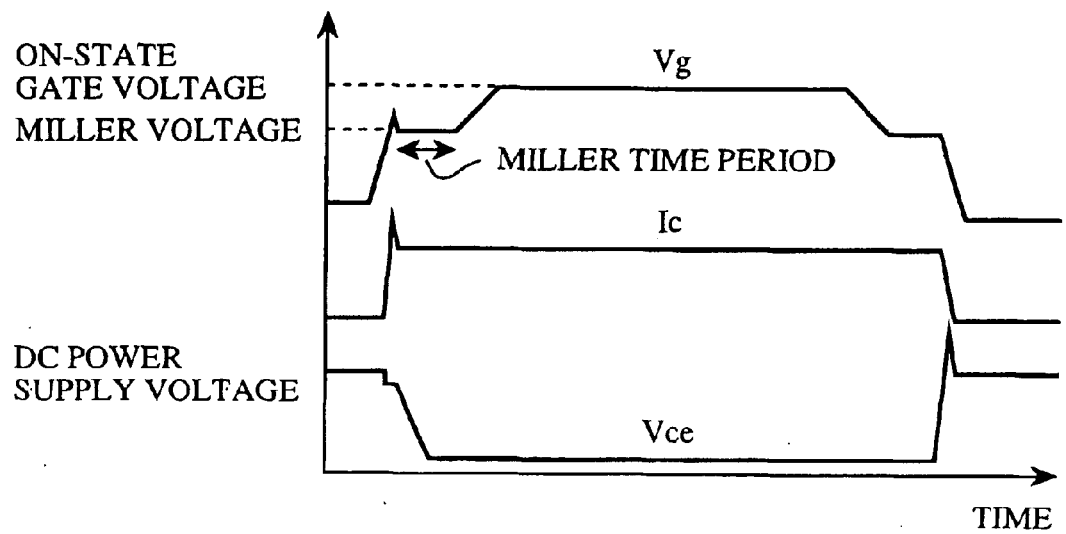
FIG. 3 is an explanatory drawing for showing the waveforms of a gate voltage, a collector-emitter voltage, and a collector current when the power semiconductor device is turned on normally.

FIG. 3 is an explanatory drawing for showing the waveforms of the gate voltage Vg, the collector-emitter voltage Vce, and the collector current Ic when an IGBT 11 is turned on under normal operating conditions. When the drive circuit sends a gate instruction to instruct the IGBT 11 to turn on in response to a turn-on instruction under normal operating conditions, the gate voltage Vg of the IGBT 11 starts rising. When the gate voltage Vg then exceeds a threshold voltage, the collector current Ic starts increasing. When the collector current Ic flowing in the IGBT 11 becomes nearly equal to an inductive load electric current flowing through the inductive load, the collector-emitter voltage Vce starts decreasing and the gate voltage Vg then becomes a nearly-constant voltage. This time period during which the gate voltage Vg is nearly constant after the collector current Ic has become nearly equal to the inductive load electric current is known as a Miller time period.

Because the electric current flowing from the gate driver is bypassed to the collector of the IGBT 11 by way of a feedback capacitance between the collector and gate of the IGBT as the collector-emitter voltage Vce changes during the Miller time period, the gate voltage Vg becomes constant. The feedback capacitance has a voltage dependency and becomes a considerably large value when the collector voltage decreases to an on-state voltage level. At the conclusion of the Miller time period, the gate voltage Vg starts rising again. At this time, the gate voltage rises slowly with a smaller time constant than that with which the gate voltage has risen before the Miller time period because the feedback capacitance is large, and then reaches a certain on-state gate voltage. The gate voltage Vg enters a steady state after it has experienced the above-mentioned transition time period.

Figure 4:
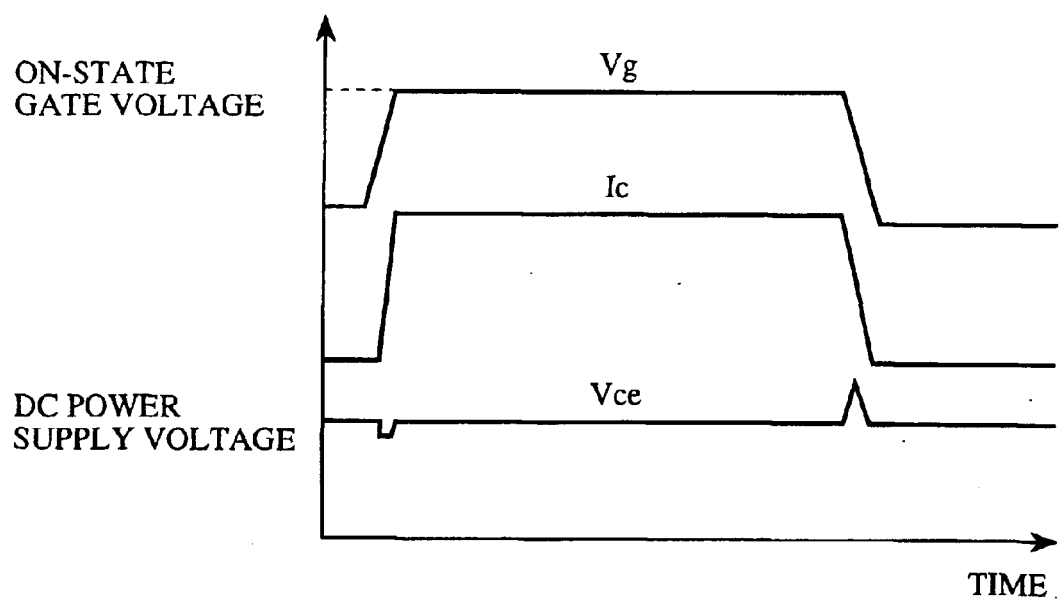
FIG. 4 is an explanatory drawing for showing the waveforms of the gate voltage, the collector-emitter voltage, and the collector current when the power semiconductor device is turned on with the power semiconductor device short-circuited.

FIG. 4 is an explanatory drawing for showing the waveforms of the gate voltage Vg, the collector-emitter voltage Vce, and the collector current Ic when the IGBT 11 is turned on with the IGBT 11 short-circuited. Here, it is assumed that a short circuit occurs in the freewheeling diode 22b reversely connected in parallel with the IGBT 11b (this short-circuit state is referred to as "when a short circuit occurs in the IGBT 11 or when the IGBT 11 is short-circuited"), as shown in FIG. 2. When the IGBT 11 becomes turned-on with the other arm freewheeling diode 22b short-circuited, a DC power supply voltage is applied directly to between the collector and emitter of the IGBT 11 and a large short-circuit current flows in the IGBT 11. This short-circuit current rises up to a saturated value that is almost determined by the gate-emitter voltage Vge (which is equal to the gate voltage Vg). At this time, because a large voltage is applied to between the collector and emitter of the IGBT 11 and a large electric current flows in the IGBT 11, the IGBT 11 will be destroyed if this state lasts for a long time.

In this short-circuit state, the gate voltage Vg has a waveform different from that under normal operating conditions and has no Miller time period, and rapidly rises up to the on-state gate voltage. This is because the collector-emitter voltage Vce hardly changes and is held at a high level in such a short-circuit state, and charge and discharge currents hardly flow through the feedback capacitance placed between the collector and gate of the IGBT because the feedback capacitance is still small. It is therefore to detect the short-circuit state by detecting a difference in the gate voltage Vg between when the IGBT is under normal operating conditions and when a short circuit occurs in the IGBT (e.g., the freewheeling diode). Similarly, the waveform of the gate current Ig when the IGBT is turned on under normal operating conditions differs from that when a short circuit occurs in the IGBT, and the quantity of a charge supplied from a controllable power source to the gate of the IGBT 11 also differs between when the IGBT is under normal operating conditions and when a short circuit occurs in the IGBT. The short-circuit state can be detected by detecting either of these differences.

Next, a description will be made as to the operation of the drive circuit for driving a power semiconductor device of FIG. 1. In response to a turn-on instruction from outside the drive circuit, the control logic 12 delivers a gate instruction to cause the IGBT 11 become turned-on to the buffer 13. When receiving the gate instruction to cause the IGBT 1 to become turned-on from the control logic 12, the buffer 13 amplifies the gate instruction and delivers the amplified gate instruction to the gate of the IGBT 11 by way of the on-state gate resistor 14a. As a result, the IGBT 11 becomes turned-on.

On the other hand, in response to a turn-off instruction from outside the drive circuit, the control logic 12 delivers a gate instruction to cause the IGBT 11 to become turned-off to the buffer 13. When receiving the gate instruction to cause the IGBT 11 to become turned-off from the control logic 12, the buffer 13 amplifies the gate instruction and delivers the amplified gate instruction to the gate of the IGBT 11 by way of the turn-off speed control circuit 15. The operation of the turn-off speed control circuit 15 will be described later. As a result, the IGBT11 becomes turned-off.

During the transition time period after the IGBT is turned on, the gate voltage Vg differs between when the IGBT is under normal operating conditions and when a short circuit occurs in the IGBT (e.g., the freewheeling diode), as mentioned above. However, after a certain time interval elapses, the gate voltage Vg reaches an identical on-state gate voltage whether the IGBT is under normal operating conditions or a short circuit occurs in the IGBT, so that the drive circuit cannot detect the occurrence of an abnormality in the IGBT 11 even by monitoring the gate voltage Vg. Then, the sampler 16 restricts the detection time period during which the gate voltage detector 17 detects the gate voltage Vg.

In other words, when the control logic 12 receives a turn-on instruction from outside the drive circuit, as shown in FIG. 5, the sampler 16 enables the gate voltage detector 17 to detect the gate voltage Vg at the time t0 when the turn-on instruction is received. After that, when a certain time elapses and a time t1 (before the gate voltage Vg reaches the on-state gate voltage, and the time t1 is determined in consideration of the characteristics of the IGBT 11) comes, the sampler 16 disables the gate voltage detector 17 to detect the gate voltage Vg. The sampler 16 only has to be able to prevent the detection of the gate voltage Vg during a time period from the time t1 to a time t2 when a turn-off instruction is received, and the detection time period from the time t0 to the time t1 can include an off-state time period (i.e., a time period before the time t0 or a time period after the time t2).

The gate voltage detector 17 detects the gate voltage Vg that appears at the gate terminal of the IGBT 11 throughout the detection time period during which the sampler 16 enables the process of detecting the gate voltage Vg. When the gate voltage Vg exceeds the reference value during the detection time period, the gate voltage detector 17 recognizes the occurrence of an abnormality in the IGBT 11 and delivers an abnormality signal to the control logic 12 and the turn-off speed control circuit 15.

In response to the abnormality signal from the gate voltage detector 17, the control logic 12 delivers a gate instruction to cause the IGBT 11 become turned-off to the buffer 13 so as to the prevent the IGBT 11 from being destroyed due to a large current. When receiving the gate instruction to cause the IGBT 11 to become turned-off from the control logic 12, the buffer 13 amplifies the gate instruction and sends the amplified gate instruction to the turn-off speed control circuit 15.

In response to the amplified gate instruction from the buffer 13, the turn-off speed control circuit 15 causes the IGBT 11 to become turned-off according to the gate instruction. In this case, because a large current flows in the IGBT 11 placed in the short-circuit state, and, when such a large current is cut off at a normal speed, a large surge voltage is generated so that the IGBT 11 can be destroyed, the turn-off speed adjustment circuit 15 turns off the IGBT 11 in such a manner that the large current is cut off at a lower speed than that at which the turn-off speed adjustment circuit 15 turns off the IGBT 11 under normal operating conditions, thereby reducing the surge voltage. However, when the main circuit wiring inductance that causes the surge voltage is sufficiently small or when a snubber circuit or the like that reduces the surge voltage is disposed outside the drive circuit, the drive circuit does not necessarily require the turn-off speed control circuit 15.

As can be seen from the above description, in accordance with this embodiment 1, the drive circuit includes the sampler 16 for allowing the process of detecting the gate voltage Vg that appears at the gate terminal of the IGBT 11 only during a transition time period before the gate voltage Vg reaches the on-state gate voltage immediately after the control logic 12 has received a turn-on instruction from outside the drive circuit, and the gate voltage detector 17 that detects the gate voltage Vg that appears at the gate terminal of the IGBT 11 throughout a detection time period during which the sampler 16 allows the process of detecting the gate voltage Vg, and that recognizes the occurrence of an abnormality in the IGBT 11 when the gate voltage Vg exceeds a reference value. Therefore, the drive circuit can protect the IGBT 11 with higher reliability by promptly detecting occurrence of a short circuit even when the IGBT 11 is resistant to high voltages.

In accordance with this embodiment 1, in response to an abnormality signal from the gate voltage detector 17, the control logic 12 sends a gate instruction to cause the IGBT 11 to become turned-off. As an alternative, a control circuit disposed outside the drive circuit and not shown in the figure can turn off the IGBT 11 in response to the abnormality signal from the gate voltage detector 17.

Furthermore, in accordance with this embodiment 1, the sampler 16 allows the process of detecting the gate voltage Vg that appears at the gate terminal of the IGBT 11 only during the transition time period before the gate voltage Vg reaches the on-state gate voltage immediately after the control logic 12 has received a turn-on instruction from outside the drive circuit. As an alternative, the drive circuit can validate the abnormality signal delivered from the gate voltage detector 17 to the control logic 12 only during the transition time period before the gate voltage Vg reaches the on-state gate voltage immediately after the control logic 12 has received a turn-on instruction from outside the drive circuit.

Embodiment 2.

FIG. 6 is a block diagram showing the structure of a drive circuit for driving a power semiconductor device in accordance with embodiment 2 of the present invention. In the figure, because the same reference numerals as shown in FIG. 1 denote the same components as those of the first embodiment or like components, the explanation of those components will be omitted hereafter. FIG. 6 shows a concrete example of a sampler 16 and a gate voltage detector 17 as shown in FIG. 1. In FIG. 6, a turn-off speed control circuit 15 is omitted, and a buffer 13 connects a gate of an IGBT 11 with a controllable source that sends out a control voltage Vcc when-the IGBT 11 is turned on, and connects the gate of the IGBT 11 with a ground when the IGBT 11 is turned off.

In FIG. 6, reference numeral 31 denotes a delay circuit that accepts a gate instruction sent thereto from a control logic 12, and sends out the gate instruction after holding it only during a time period from a time t0 to a time t1. The delay circuit 31 can be a combination of a CR filter and a buffer or comparator, or a delay line. Reference numeral 32 denotes an inverter for inverting the logic of the gate instruction sent thereto from the delay circuit 31 so as to place an Nch-MOSFET 33 in an off state only throughout a detection time period during which the gate voltage Vg of the IGBT 11 is detected. The Nch-MOSFET 33 is turned on or off according to an output signal of the inverter 32. A switch that is turned on or off according to the output signal of the inverter 32 can be used instead of the Nch-MOSFET. For example, such a switch as a bipolar transistor can be used.

Reference numerals 34 and 35 denote dividing resistors for dividing the gate voltage Vg of the IGBT 11 so as to generate a divided voltage and for applying the divided voltage to a comparator 38, and reference numerals 36 and 37 denote dividing resistors for dividing a control voltage Vcc so as to generate a divided voltage (i.e., a reference value) and for applying the divided voltage to the comparator 38. The dividing resistors 34 to 37 are so preset that when the gate voltage Vg reaches the control voltage Vcc, the divided voltage obtained thereby from the gate voltage Vg somewhat exceeds the reference value. The gate voltage Vg of the IGBT 11 can be divided by three or more resistors in series, instead of the two resistors in series, as shown in FIG. 6, and the control voltage Vcc can be also divided by three or more resistors in series, instead of the two resistors in series, as shown in FIG. 6. As an alternative, either or both of the gate voltage Vg of the IGBT 11 and the control voltage Vcc can be divided by a series of a Zener diode and a resistor, instead of two or more resistors in series. Furthermore, when the power-supply voltage of the comparator 38 is higher than the control voltage Vcc, the gate voltage Vg and the control voltage Vcc can be input directly to the comparator. The comparator 38 compares the divided voltage obtained from the gate voltage Vg with the reference value. Reference numeral 39 denotes a resistor.

Next, a description will be made as to an operation of the drive circuit for driving a power semiconductor device in accordance with embodiment 2 of the present invention. When the control logic 12 receives a turn-on instruction from outside the drive circuit and sends out a gate instruction to cause the IGBT 11 become turned-on, the delay circuit 31 of the sampler 16 holds the gate instruction only during a time period from a time t0 to a time t1 in order to set a time when the detection of the gate voltage Vg is finished as the time t1, and then delivers the gate instruction to the inverter 32. When receiving the gate instruction from the delay circuit 31, the inverter 32 inverts the logic of the gate instruction and sends it to the gate of the Nch-MOSFET 33.

As a result, because the gate of the Nch-MOSFET 33 has a Low level as shown in FIG. 7 before the time t1 comes, that is, before receiving the gate instruction whose logic has been inverted by the inverter 32, the Nch-MOSFET 33 is placed in an off state before the time t1. In contrast, because the gate of the Nch-MOSFET 33 has a High level at the time t1, that is, when receiving the gate instruction whose logic has been inverted by the inverter 32, the Nch-MOSFET 33 becomes an on state at the time t1.

The dividing resistors 34 and 35 of the gate voltage detector 17 divide the gate voltage Vg of the IGBT 11 so as to generate a divided voltage and applies the divided voltage to the comparator 38, and the dividing resistors 36 and 37 divide the control voltage Vcc so as to generate a divided voltage (i.e., a reference value) and applies the divided voltage to the comparator 38. Because the Nch-MOSFET 33 is placed in an off state before the time t1, as mentioned above, the divided voltage obtained from the gate voltage Vg by the dividing resistors 34 and 35 is applied to the comparator 38. When the time t1 comes, the divided voltage decreases to the on-state voltage of the Nch-MOSFET 33 because the Nch-MOSFET 33 becomes an on state. As a result, the comparator 38 sends out no abnormality signal even if the gate voltage Vg reaches the control voltage Vcc in level. The comparator 38 is thus disabled under normal operating conditions.

In contrast, when a short circuit occurs in the IGBT 11, the gate voltage Vg reaches the control voltage Vcc in level before the Nch-MOSFET 33 becomes an on state and the divided voltage obtained from the gate voltage Vg somewhat exceeds the reference value. Therefore the comparator 38 delivers an abnormality signal to the control logic 12. As a result, the control logic 12 causes the IGBT 11 to become turned-off, like that of above-mentioned embodiment 1. This embodiment 2 thus offers an advantage of being able to protect the IGBT 11 with higher reliability by promptly detecting occurrence of a short circuit without causing complication of the structure of the drive circuit even when the IGBT 11 is resistant to high voltages.

Embodiment 3.

Figure 8:
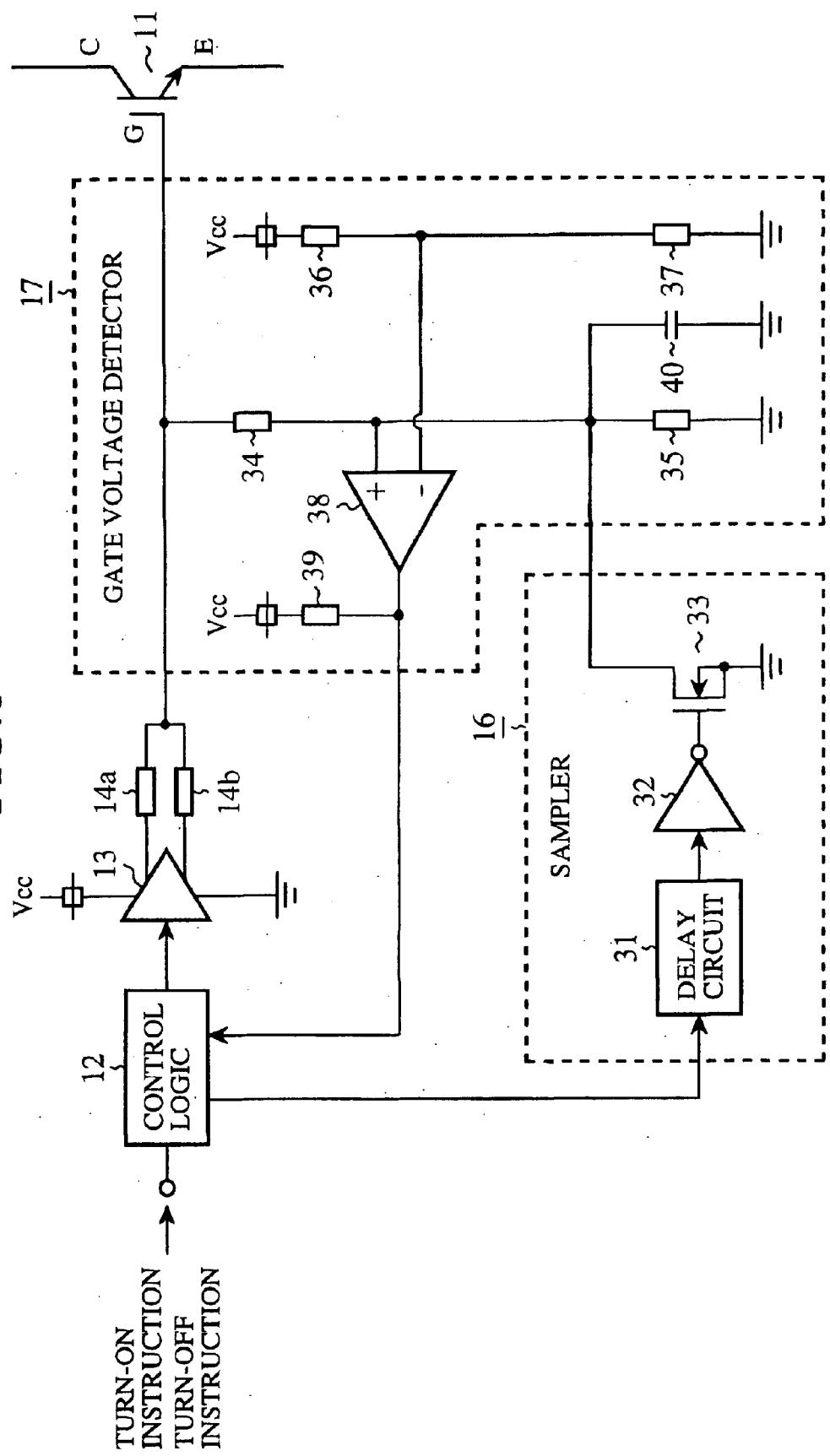
FIG. 8 is a block diagram showing the structure of a drive circuit for driving a power semiconductor device according to embodiment 3 of the present invention.

FIG. 8 is a block diagram showing the structure of a drive circuit for driving a power semiconductor device in accordance with embodiment 3 of the present invention. In the figure, because the same reference numerals as shown in FIG. 6 denote the same components as those of the second embodiment or like components, the explanation of those components will be omitted hereafter. Reference numeral 40 denotes a capacitor connected in parallel with a dividing resistor 35.

Hereafter, an operation of the capacitor 40 will be explained. FIG. 9 is an explanatory drawing for showing a gate voltage detection signal (i.e., a divided voltage obtained from a gate voltage Vg by dividing resistors 34 and 35) when no capacitor is connected in parallel with the dividing resistor 35 and when the capacitor 40 is connected in parallel with the dividing resistor 35. Because the gate voltage detection signal has a waveform equal to that of the divided voltage, the waveform is similar to that of the gate voltage Vg.

When an IGBT 11a becomes turned-on in a half-bridge circuit as shown in FIG. 2, a recovery electric current flowing in a diode 22b is superimposed on a collector current Ic flowing in the IGBT, and a current peak appears in the waveform of the collector current Ic (see FIG. 3). Therefore, a voltage peak appears in the gate voltage Vg. In the meantime the collector current Ic changes greatly with time, and an induced voltage can be superimposed on the gate voltage Vg. There is a possibility that when the peak of the gate voltage Vg increases, a comparator 38 of a gate voltage detector 17 operates from the peak voltage of the gate voltage Vg and then delivers an abnormality signal under normal operating conditions. Such a situation can be prevented by masking changes in the gate voltage Vg, which are caused by the recovery voltage of the diode 22b and the induced voltage when the IGBT 11a is turned on.

In accordance with this embodiment 3, in order to prevent such a situation from occurring, the capacitor 40 is connected in parallel with the dividing resistor 35. Because the response speed of the input of the comparator 38 is reduced by the capacitor 40 connected in parallel with the dividing resistor 35, changes in the gate voltage Vg can be masked when the IGBT 11a is turned on, as shown in FIG. 9. Furthermore, because the gate voltage detection signal slowly rises in level and the length of time for the gate voltage detection signal to enter a steady state is therefore increased, as shown in FIG. 9, the detection time period during which the gate voltage Vg is detected is increased from the one from a time t0 to a time t1 to the one from the time t0 to a time t3. In accordance with this embodiment 3, because the drive circuit can prevent the gate voltage detector 17 from malfunctioning under normal operating conditions, the reliability of the drive circuit for driving a power semiconductor element can be improved.

Embodiment 4.

Figure 10:
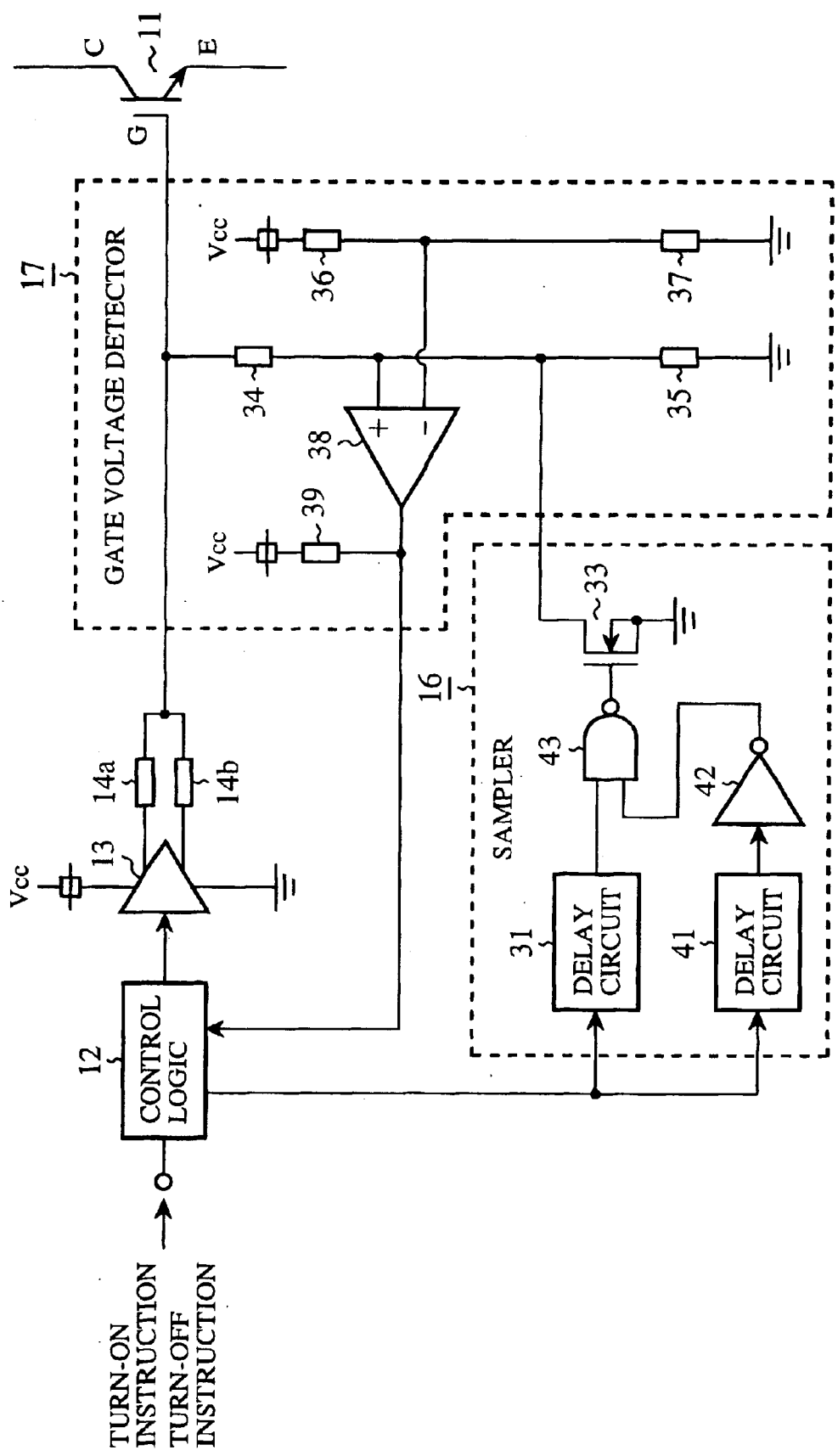
FIG. 10 is a block diagram showing the structure of a drive circuit for driving a power semiconductor device according to embodiment 4 of the present invention.

FIG. 10 is a block diagram showing the structure of a drive circuit for driving a power semiconductor device in accordance with embodiment 4 of the present invention. In the figure, because the same reference numerals as shown in FIG. 6 denote the same components as those of the second embodiment or like components, the explanation of those components will be omitted hereafter. In FIG. 10, reference numeral 41 denotes a delay circuit that accepts a gate instruction sent thereto from a control logic 12, and sends out the gate instruction after holding it only during a time period from a time t0 to a time t3, reference numeral 42 denotes an inverter for inverting the logic of the gate instruction sent thereto from the delay circuit 41, and reference numeral 43 denotes a NAND circuit for placing an Nch-MOSFET 33 in an off state only during a time period from the time t4 to a time t1.

In accordance with above-mentioned embodiment 2, a sampler 16 allows a process of detecting a gate voltage Vg that appears at the gate terminal of an IGBT 11 when the time t0 comes immediately after the control logic 12 has received a turn-on instruction from outside the drive circuit. In contrast, in accordance with embodiment 4, the detection time period during which the gate voltage Vg is detected excludes a certain time period (e.g., the time period from the time t0 to the time t4) immediately after the IGBT 11 is turned on.

Figure 11:
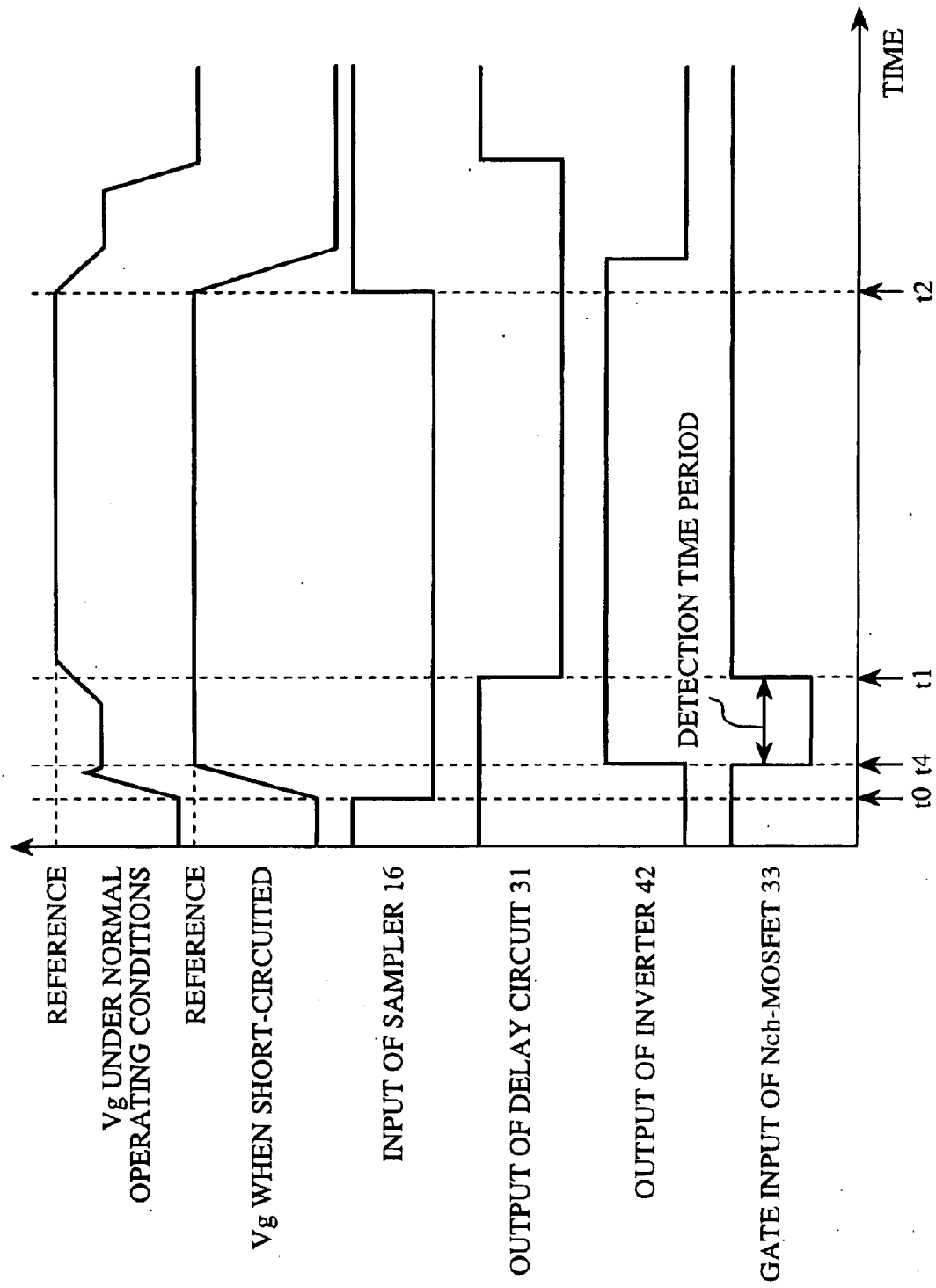
FIG. 11 is an explanatory drawing for showing an operation sequence of the drive circuit for driving the power semiconductor device according to embodiment 4 of the present invention.

When the control logic 12 receives a turn-on instruction from outside the drive circuit and sends out a gate instruction to cause the IGBT 11 to become turned-on, the delay circuit 31 of the sampler 16 holds the gate instruction only during the time period from the time t0 to the time t1 in order to set a time when the detection of the gate voltage Vg is finished to the time t1, and then furnishes the gate instruction to the NAND circuit 43, as shown in FIG. 11. On the other hand, when receiving the gate instruction to cause the IGBT 11 to become turned-on from the control logic 12, the delay circuit 41 of the sampler 16 holds the gate instruction only during the time period from the time t0 to the time t4 in order for the detection time period during which the gate voltage Vg is detected to start after the conclusion of the recovery time period at the turn-on time, i.e., in order to set a time when the detection of the gate voltage Vg is started to the time t3, and then furnishes the gate instruction to the inverter 42.

When receiving the gate instruction from the delay circuit 41, the inverter 42 inverts the logic of the gate instruction and furnishes it to the NAND circuit 43. When thus receiving those signals from the delay circuit 31 and the inverter 42, the NAND circuit 43 delivers a logical signal to cause the Nch-MOSFET 33 to enter an off state to the gate of the Nch-MOSFET 33 only during the time period from the time t4 to the time t1, as shown in FIG. 11.

As a result, the Nch-MOSFET 33 is placed in an off state only during the time period from the time t4 to the time t1.

After that, the drive circuit of embodiment 4 operates in the same way that that of embodiment 2 does, and therefore the description of the operation will be omitted hereafter. In accordance with this embodiment 4, because the drive circuit can prevent the gate voltage detector 17 from malfunctioning under normal operating conditions, the reliability of the drive circuit for driving a power semiconductor element can be improved.

In accordance with this embodiment 4, the delay circuit 41 receives a gate instruction to cause the IGBT 11 to become turned-on from the control logic 12. In a variant, the buffer 13 can consist of inverters, and the drive circuit can be so constructed that the delay circuit 41 accepts the output of the buffer 13. In this case, the drive circuit does not require the inverter 42. Furthermore, a capacitor 40 can be connected in parallel with a dividing resistor 35, like that of above-mentioned embodiment 3.

Embodiment 5.

Figure 12:
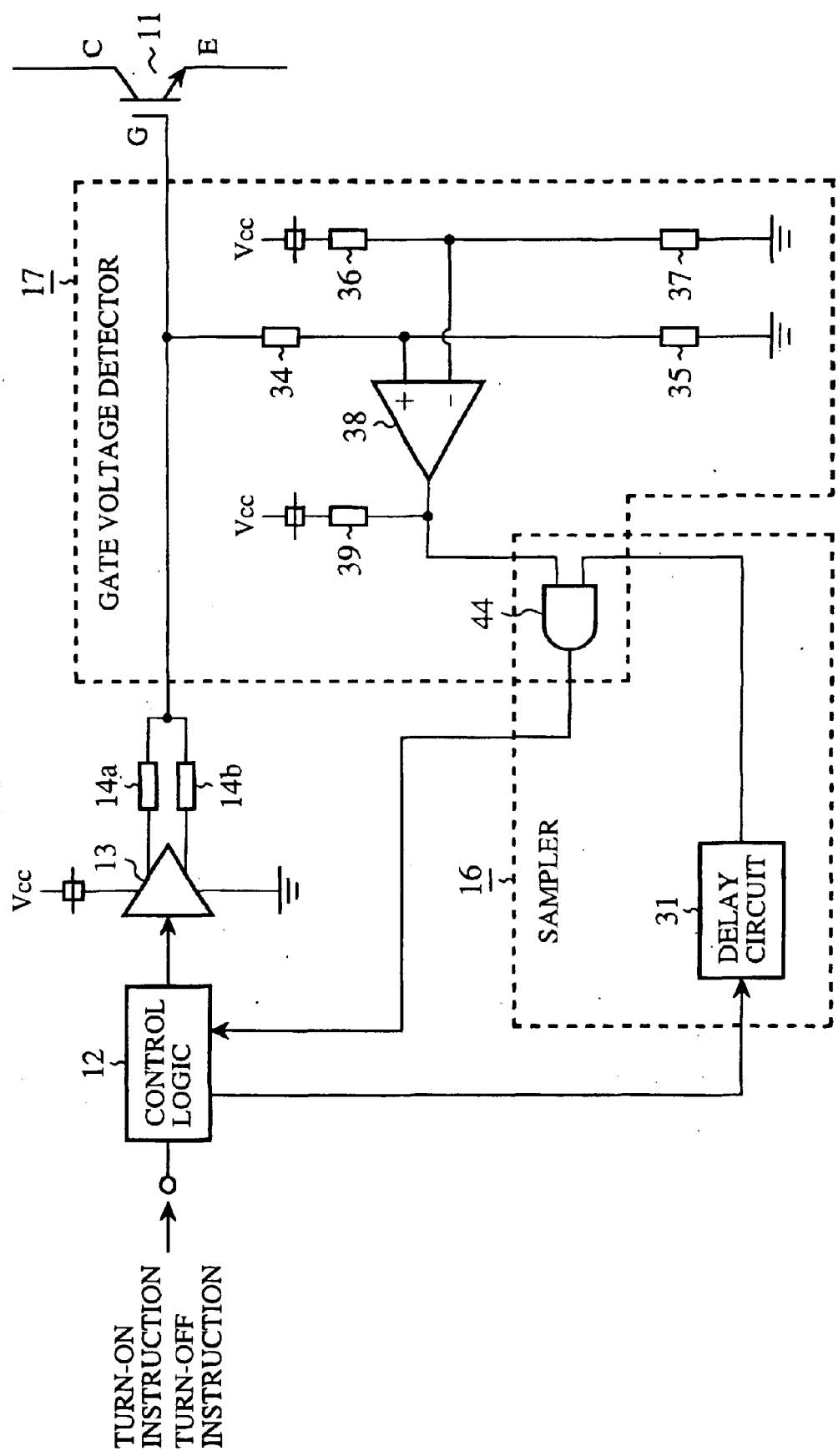
FIG. 12 is a block diagram showing the structure of a drive circuit for driving a power semiconductor device according to embodiment 5 of the present invention.

FIG. 12 is a block diagram showing the structure of a drive circuit for driving a power semiconductor device in accordance with embodiment 5 of the present invention. In the figure, because the same reference numerals as shown in FIG. 6 denote the same components as those of the second embodiment or like components, the explanation of those components will be omitted hereafter. Reference numeral 44 denotes an AND circuit for implementing a logical AND operation on an output signal of a comparator 38 and an output signal of a delay circuit 31.

Next, a description will be made as to an operation of the drive circuit for driving a power semiconductor device in accordance with embodiment 5 of the present invention. The delay circuit 31 of a sampler 16 has a preset delay time with which the level of its output signal makes a transition from a High level to a Low level at a time t1 when a detection time period during which the gate voltage Vg of an IGBT is detected is ended, like that of above-mentioned embodiment 2 (see FIG. 13). The comparator 38 of a gate voltage detector 17 compares a divided voltage obtained from the gate voltage Vg of the IGBT with a divided voltage obtained from the control voltage Vcc of the IGBT, like that of above-mentioned embodiment 2, and, when the gate voltage Vg reaches the control voltage Vcc in level, causes its output signal to make a transition from a Low level to a High level (see FIG. 13).

Figure 13:
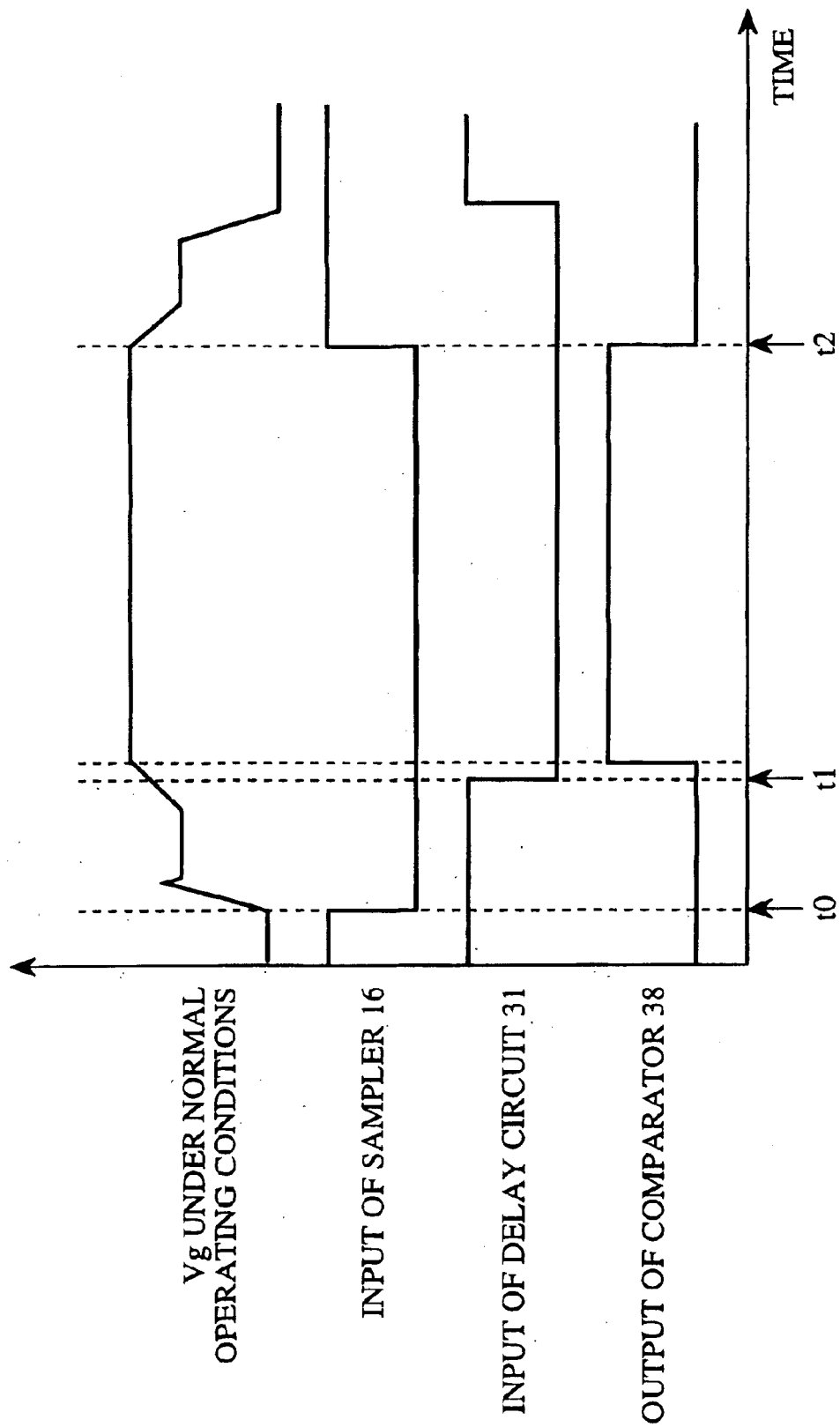
FIG. 13 is an explanatory drawing for showing an operation sequence of the drive circuit for driving the power semiconductor device according to embodiment 5 of the present invention.

The AND circuit 44 receives the output signal of the comparator 38 and the output signal of the delay circuit 31 and then implements a logical AND operation on them. Because the output signal of the comparator 38 becomes a High level under normal operating conditions after the output signal of the delay circuit 31 has become a Low level at the time t1, as shown in FIG. 13, the output signal of the AND circuit 44 remains at a Low level. On the other hand, when a short circuit occurs in the IGBT 11, the output-signal of the AND circuit 44 becomes a High level (i.e., a logical level indicating a detection of the occurrence of an abnormality in the IGBT) because the output signal of the comparator 38 becomes a High level before the output signal of the delay circuit 31 becomes a Low level.

After that, the drive circuit operates in the same way that that of embodiment 2 does, and therefore the description of the operation will be omitted hereafter. In accordance with this embodiment 5, because the drive circuit can prevent the gate voltage detector 17 from malfunctioning under normal operating conditions, the reliability of the drive circuit for driving a power semiconductor element can be improved. The detection time period during which the gate voltage Vg is detected can exclude a recovery time period immediately after the IGBT is turned on, like that of above-mentioned embodiment 4.

Embodiment 6.

Figure 14:
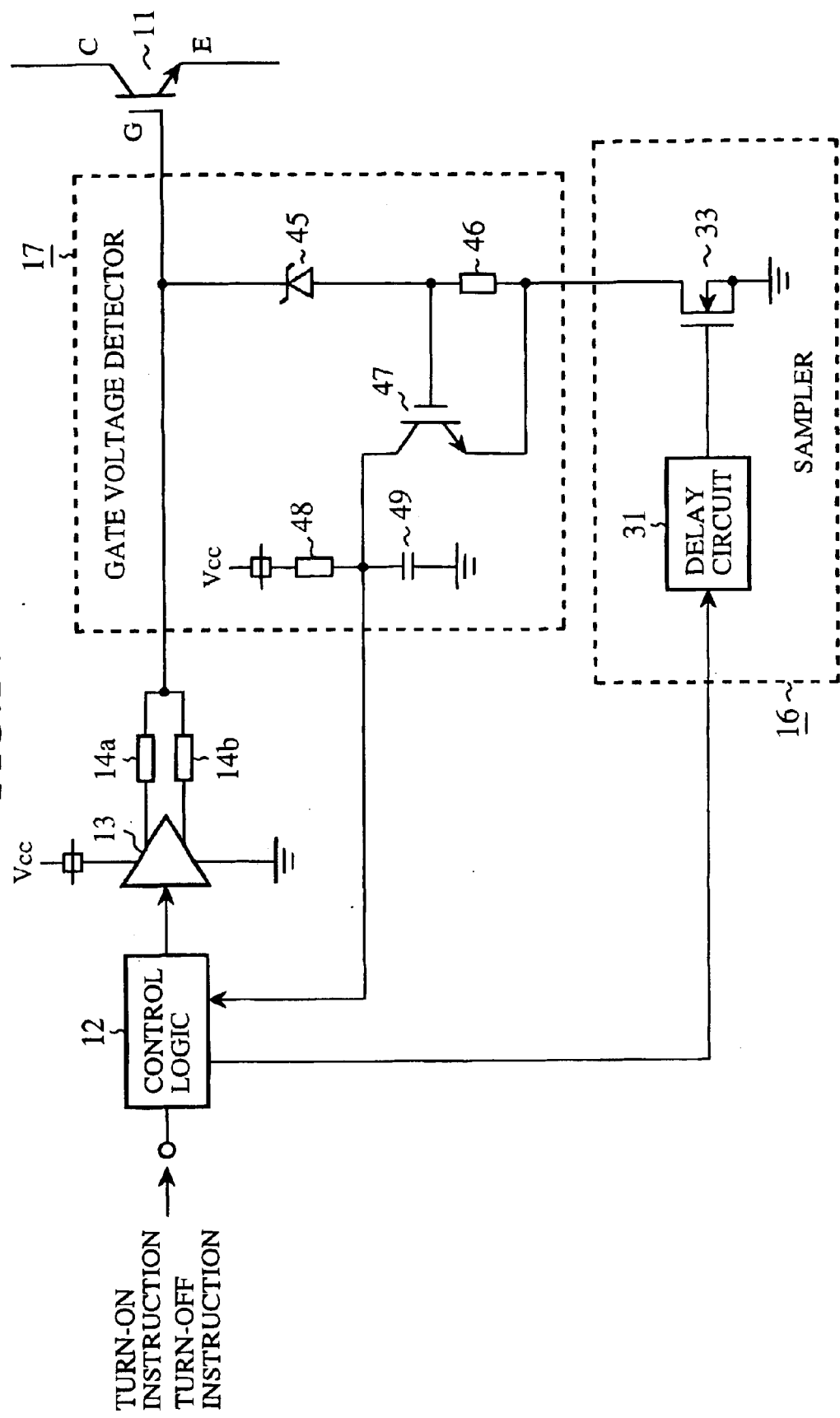
FIG. 14 is a block diagram showing the structure of a drive circuit for driving a power semiconductor device according to embodiment 6 of the present invention.

FIG. 14 is a block diagram showing the structure of a drive circuit for driving a power semiconductor device in accordance with embodiment 6 of the present invention. In the figure, because the same reference numerals as shown in FIG. 6 denote the same components as those of the second embodiment or like components, the explanation of those components will be omitted hereafter. In FIG. 14, reference numeral 45 denotes a Zener diode having a cathode connected with a gate terminal of an IGBT 11. The Zener diode 45 breaks down as the gate voltage Vg of the IGBT reaches the control voltage Vcc of the IGBT 11. Reference numeral 46 denotes a resistor having an end connected with an anode of the Zener diode 45, and another end connected with a drain of an Nch-MOSFET 33, reference numeral 47 denotes a transistor having a base connected with the anode of the Zener diode 45, and an emitter connected with the drain of the. Nch-MOSFET 33, and reference numeral 48 denotes a resistor having an end connected with a controllable power source, and another end connected with a collector of the transistor 47, reference numeral 48 denotes a capacitor having an end connected with the collector of the transistor 47, and another end connected with a ground.

Next, a description will be made as to an operation of the drive circuit for driving a power semiconductor device in accordance with embodiment 6 of the present invention. A gate voltage detector 17 operates when the Nch-MOSFET 33 of a sampler 16 becomes an on state. The Zener diode 45 of the gate voltage detector 17 has a Zener voltage that breaks down as the gate voltage Vg reaches the control voltage Vcc. While the Nch-MOSFET 33 is placed in an on state, the Zener diode 45 breaks down when the gate voltage Vg reaches the control voltage Vcc in level.

As a result, because a voltage is generated between the both ends of the resistor 46 and the transistor 47 becomes turned-on, the capacitor 49 enters a discharge state and the gate voltage detector 17 delivers an output signal at a Low level to a control logic 12. Therefore, the time period during which the Nch-MOSFET 33 is turned on becomes a detection time period during which the gate voltage Vg of the IGBT is detected. Accordingly, because the sampler 16 has to cause the Nch-MOSFET 33 to become an off state at the conclusion of the detection time period, the delay circuit 31 receives an input at a Low level from the control logic 12 when the IGBT is turned on, like that of above-mentioned embodiment 2, and the delay circuit 31 delivers a signal at a Low level to the gate of the Nch-MOSFET 33 at the conclusion of the detection time period. In accordance with this embodiment 6, the drive circuit can protect a short circuit from occurring in the IGBT 11 without providing an inverter 32 as shown in above-mentioned embodiment 2.

Embodiment 7.

Figure 15:
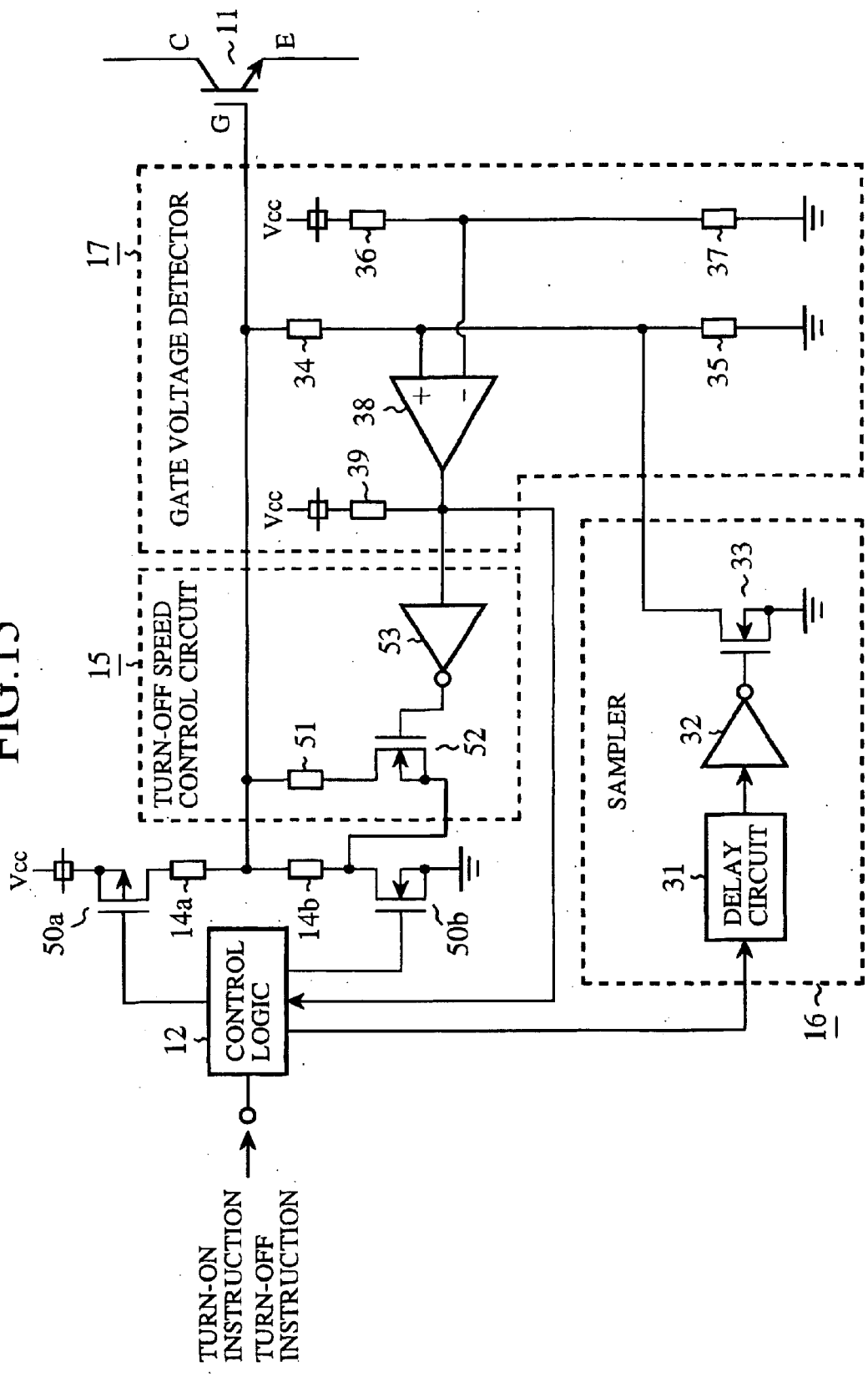
FIG. 15 is a block diagram showing the structure of a drive circuit for driving a power semiconductor device according to embodiment 7 of the present invention.

FIG. 15 is a block diagram showing the structure of a drive circuit for driving a power semiconductor device in accordance with embodiment 7 of the present invention. In the figure, because the same reference numerals as shown in FIG. 6 denote the same components as those of the second embodiment or like components, the explanation of those components will be omitted hereafter. Reference numeral 50a denotes a Pch-MOSFET that is turned on or off according to a gate instruction sent thereto from a control logic 12, and reference numeral 50b denotes an Nch-MOSFET that is turned on or off according to the gate instruction sent thereto from the control logic 12. Bipolar transistors can be used instead of the MOSFETs 50a and 50b, for example. Reference numeral 51 denotes a resistor, reference numeral 52 denotes an Nch-MOSFET, and reference numeral 53 denotes an inverter for causing the Nch-MOSFET 52 to become turned-on or turned-off according to an output signal of a gate voltage detector 17.

Next, a description will be made as to a difference between this embodiment 7 and above-mentioned embodiment 2. In other words, a turn-off operation under normal operating conditions and a turn-off operation when the gate voltage detector 17 detects occurrence of a short circuit will be explained. The inverter 53 sends out an output signal at a High level under normal operating conditions. At nearly the same time when the Nch-MOSFET 50b becomes turned-on according to a gate instruction (i.e., a gate instruction to cause the IGBT11 to become turned-off) from the control logic 12, the Nch-MOSFET 52 becomes turned-on too. At this time, the drive circuit has an off-state gate resistor having a resistance substantially equal to that of the resistors 14b and 51 connected in parallel.

When detecting occurrence of a short circuit, the gate voltage detector 17 operates and the output signal of the inverter 53 becomes a Low level, so that the Nch-MOSFET 52 becomes turned-off. At this time, because the off-state gate resistor consists of only the resistor 14, the drive circuit can turn off the IGBT 11 at a lower speed than that at which the drive circuit turns off the IGBT 11 under normal operating conditions. In accordance with this embodiment 7, the drive circuit can thus turn off the IGBT 11 at a lower speed than that at which the drive circuit turns off the IGBT 11 under normal operating conditions by using a turn-off speed adjustment circuit 15, thereby reducing the serge voltage.

Embodiment 8.

Figure 16:
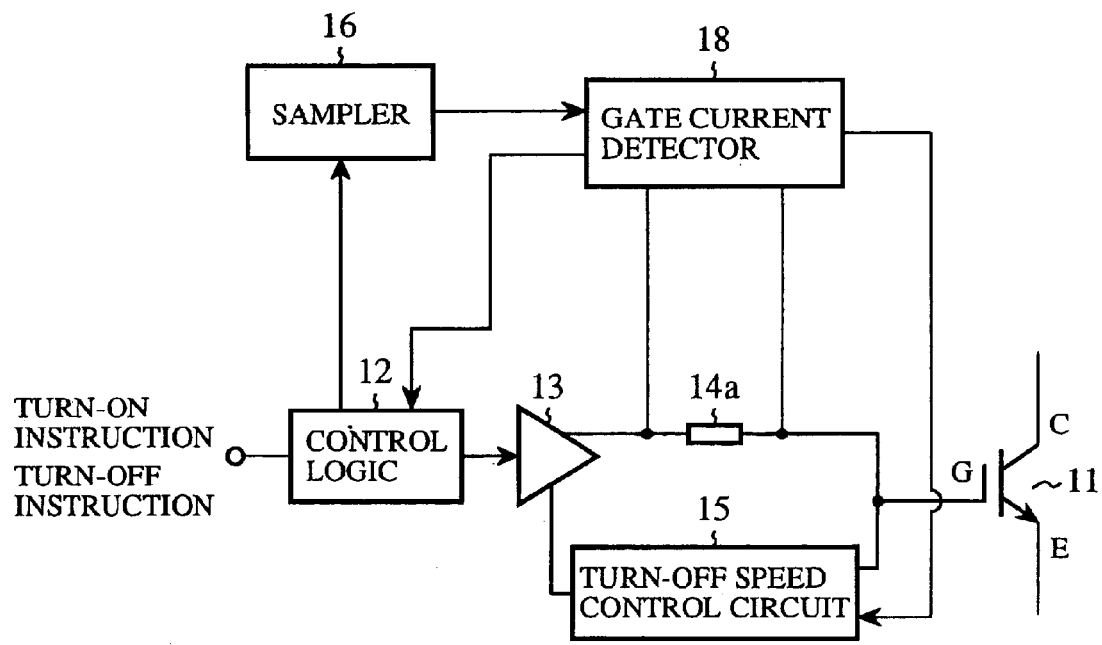
FIG. 16 is a block diagram showing the structure of a drive circuit for driving a power semiconductor device according to embodiment 8 of the present invention.

FIG. 16 is a block diagram showing the structure of a drive circuit for driving a power semiconductor device in accordance with embodiment 8 of the present invention. In the figure, because the same reference numerals as shown in FIG. 1 denote the same components as those of the first embodiment or like components, the explanation of those components will be omitted hereafter. Reference numeral 18 denotes a gate current detector (i.e., a controllable variable value detection means and an abnormality detection means) that detects a gate current Ig flowing in a gate terminal of an IGBT 11, as a controllable variable value that is applied to the IGBT 11 and is controlled by a buffer 13, throughout a time period during which a sampler 16 allows the detection process of detecting the gate current Ig, and that recognizes the occurrence of an abnormality in the IGBT 11 when the gate current Ig becomes equal to or lower than a reference value.

In accordance with above-mentioned embodiment 1, the gate voltage detector detects the gate voltage Vg that appears at the gate terminal of the IGBT 11 as the controllable variable value that is applied to the IGBT 11 and is controlled by the buffer 13. In contrast, in accordance with embodiment 8, the gate current detector can detect occurrence of a short circuit by detecting the gate current Ig flowing in the gate terminal of the IGBT 11.

Figure 17:
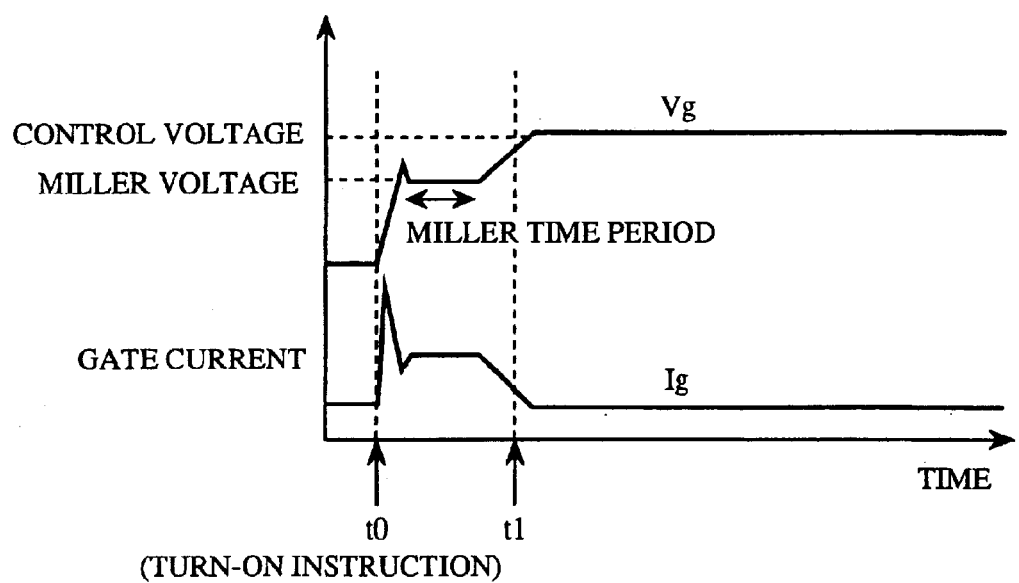
FIG. 17 is an explanatory drawing for showing the waveforms of a gate voltage and a gate current when the power semiconductor device is turned on under normal operating conditions.
Figure 18:
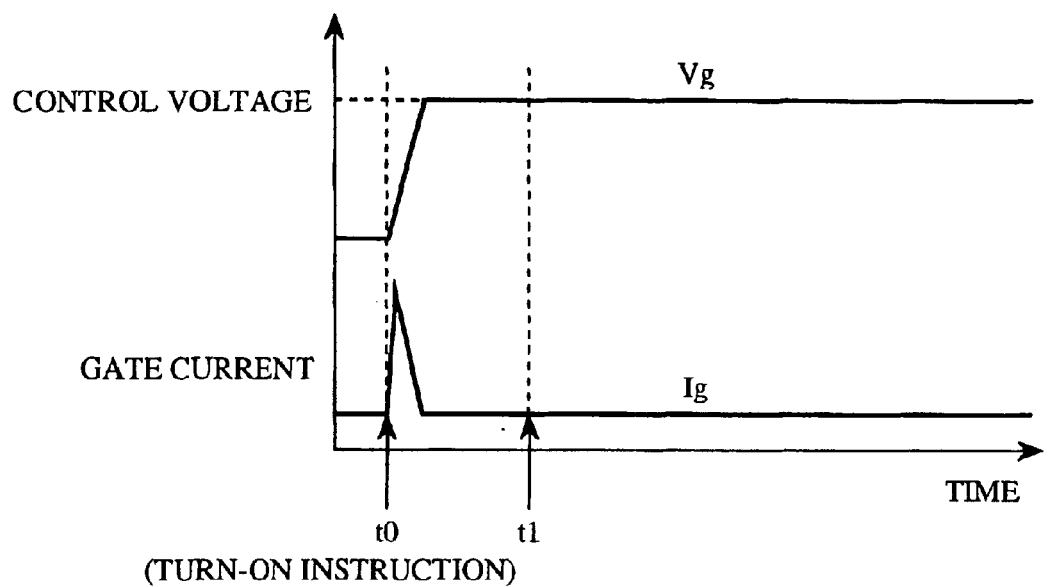
FIG. 18 is an explanatory drawing for showing the waveforms of the gate voltage and the gate current when the power semiconductor device is turned on with the power semiconductor device short-circuited.

FIG. 17 is an explanatory drawing showing the waveforms of the gate voltage Vg and the gate current Ig when the IGBT is turned on under normal operating conditions, and FIG. 18 is an explanatory drawing showing the waveforms of the gate voltage Vg and the gate current Ig when the IGBT is turned on with the IGBT short-circuited. As explained in above-mentioned embodiment 1, when the IGBT is turned on under normal operating conditions, a Miller time period appears and the gate voltage Vg becomes constant. At this time, the gate current Ig becomes nearly constant as shown in FIG. 17, and decreases gradually after the conclusion of the Miller time period. On the other hand, when a short circuit occurs in the IGBT 11, there is no Miller time period, as shown in FIG. 18, and the gate voltage Vg rapidly rises up to the control voltage Vcc. The gate current Ig decreases soon after rapidly rising, like the gate voltage Vg, immediately after the IGBT is turned on. In other words, while the gate current Ig immediately vanishes when a short circuit occurs in the IGBT 11, the gate current Ig remains at a constant value during the Miller time period and then vanishes under normal operating conditions. It is therefore possible to detect the occurrence of a short circuit by detecting this difference.

In accordance with this embodiment 8, the gate current detector 18 detects the gate current Ig flowing in the gate terminal of the IGBT 11 throughout the detection time period during which the sampler 16 allows the detection process of detecting the gate current Ig, and delivers an abnormality signal to a control logic 12 when the gate current Ig becomes equal to or lower than a reference value.

The sampler 16 in accordance with this embodiment 8 restricts the detection time period during which the gate current detector 18 detects the gate current Ig, and, instructs the gate current detector 18 to start the detection process of detecting the gate current Ig at a time t0 when the control logic 12 receives a turn-on instruction, as shown in FIGS. 17 and 18. The sampler 16 then instructs the gate current detector 18 to end the detection process of detecting the gate current Ig at a time t1 before the gate current Ig decreases to zero under normal operating conditions. The drive circuit according to this embodiment 8 can thus protect the IGBT 11 with higher reliability by promptly detecting the occurrence of a short circuit even when the IGBT 11 is resistant to high voltages, like that of above-mentioned embodiment 1.

Embodiment 9.

Figure 19:
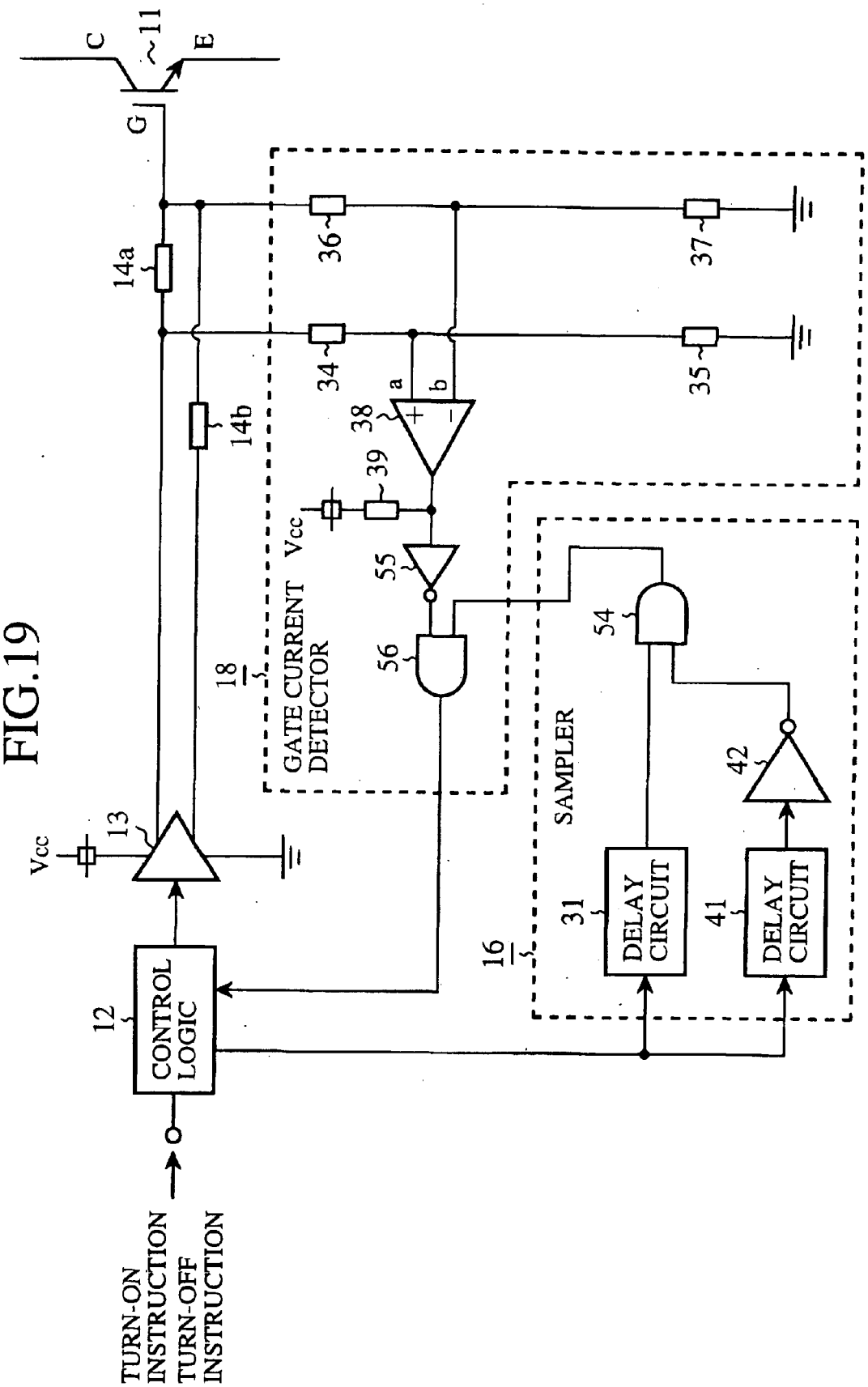
FIG. 19 is a block diagram showing the structure of a drive circuit for driving a power semiconductor device according to embodiment 9 of the present invention.

FIG. 19 is a block diagram showing the structure of a drive circuit for driving a power semiconductor device in accordance with embodiment 9 of the present invention. In the figure, because the same reference numerals as shown in FIG. 10 denote the same components as those of the fourth embodiment or like components, the explanation of those components will be omitted hereafter. FIG. 19 shows a concrete example of a sampler 16 and a gate current detector 18 as shown in FIG. 18. A turn-off speed control circuit 15 is omitted in this embodiment. Reference numeral 54 denotes an AND circuit for validating an abnormality signal delivered from the gate current detector 18 only during a time period from a time t0 to a time t1, reference numeral 55 denotes an inverter for inverting the logic of an output signal of a comparator 38, and reference numeral 56 denotes an AND circuit for implementing a logical AND operation on an output signal of an inverter 55 and the output signal of the AND circuit 54.

Next, a description will be made as to an operation of the drive circuit for driving a power semiconductor device in accordance with embodiment 9 of the present invention. A voltage that appears at an end of an on-state gate resistor 14a connected to a buffer 13 is divided by dividing resistors 34 and 35 and is applied to an input pin a of the comparator 38, and a voltage that appears at another end of the on-state gate resistor 14a connected to the IGBT 11 is divided by dividing resistors 36 and 37 and is applied to another input pin b of the comparator 38. When a gate current Ig flows in the on-state gate resistor 14a while the IGBT 11 is turned on, the input pin a of the comparator 38 has a potential higher than that of the other input pin b and the output signal of the comparator 38 becomes a High level. On the other hand, when the gate current Ig becomes zero and the potential of the input pin a becomes equal to that of the other input pin b, the output signal of the comparator 38 becomes a Low level.

The inverter 55 inverts the logic of the output signal of the comparator 38, and the output signal of the inverter 55 is input to the AND circuit 56. Although the sampler 16 has nearly the same structure as that of FIG. 10, the sampler 16 has an AND circuit 54 instead of the NAND circuit 43, and is so constructed as to deliver a pulse signal at a High level only throughout a detection time period during which the gate current Ig is detected (i.e., a time period from a time t0 to a time t1 of FIGS. 17 and 18).

While the sampler 16 delivers the signal at a High level to the AND circuit 56 during the time period from the time t0 to the time t1 under normal operating conditions, the inverter 55 delivers a signal at a Low level to the AND circuit 56 because the gate current Ig still flows even at the time t1 and the comparator 38 outputs a signal at a High level. Therefore, the AND circuit 56 delivers a signal at a Low level. On the other hand, when a short circuit occurs in the IGBT 11, because the gate current Ig becomes zero before the time t1 and the comparator 38 outputs a signal at a Low level, a signal at a High level is delivered to the AND circuit 56 and the AND circuit 56 therefore outputs a signal at a High level (indicating the detection of an abnormality). In accordance with this embodiment 9, because the drive circuit can prevent the gate current detector 18 from malfunctioning under normal operating conditions, the reliability of the drive circuit for driving a power semiconductor device can be improved.

Embodiment 10.

Figure 20:
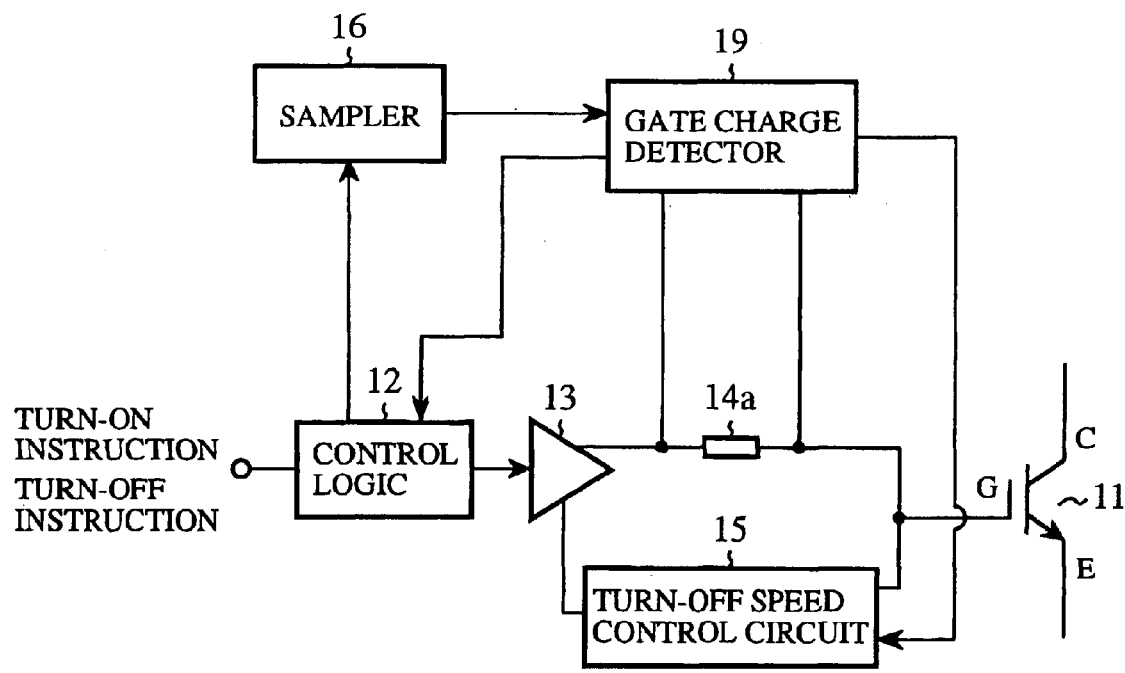
FIG. 20 is a block diagram showing the structure of a drive circuit for driving a power semiconductor device according to embodiment 10 of the present invention.

FIG. 20 is a block diagram showing the structure of a drive circuit for driving a power semiconductor device in accordance with embodiment 10 of the present invention. In the figure, because the same reference numerals as shown in FIG. 1 denote the same components as those of the first embodiment or like components, the explanation of those components will be omitted hereafter. Reference numeral 19 denotes a gate charge detector (i.e., a controllable variable value detection means and an abnormality detection means) for detecting an amount of charge supplied to a gate terminal of an IGBT 11, as a controllable variable value that is applied to the IGBT 11 and is controlled by a buffer 13, throughout a time period during which a sampler 16 allows the detection process of detecting the amount of gate charge, and for, when the amount of gate charge is equal to or less than a reference value, recognizing that an abnormality occurs in the IGBT 11, the gate charge detector 19 consisting of an integrating circuit that integrates a gate current Ig flowing in the gate terminal of the IGBT and a comparison circuit that compares the integral value with the reference value.

In accordance with above-mentioned embodiment 1, the drive circuit detects a gate voltage Vg that appears at the gate terminal of the IGBT 11 as the controllable variable value that is applied to the IGBT 11 and is controlled by the buffer 1. In contrast, the drive circuit in accordance with embodiment 10 detects the occurrence of a short circuit by detecting the amount of gate charge supplied to the gate terminal of the IGBT 11.

Figure 21:
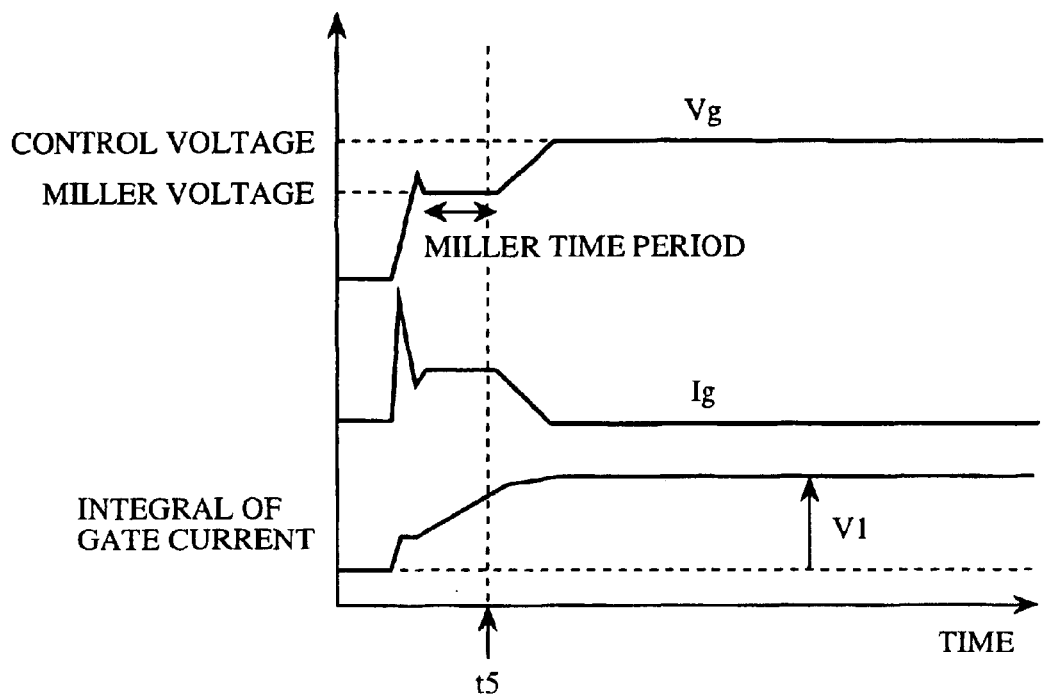
FIG. 21 is an explanatory drawing for the waveforms of a gate voltage, a gate current, and an integral (i.e., an amount of charge) of the gate current when the power semiconductor device is turned on under normal operating conditions.
Figure 22:
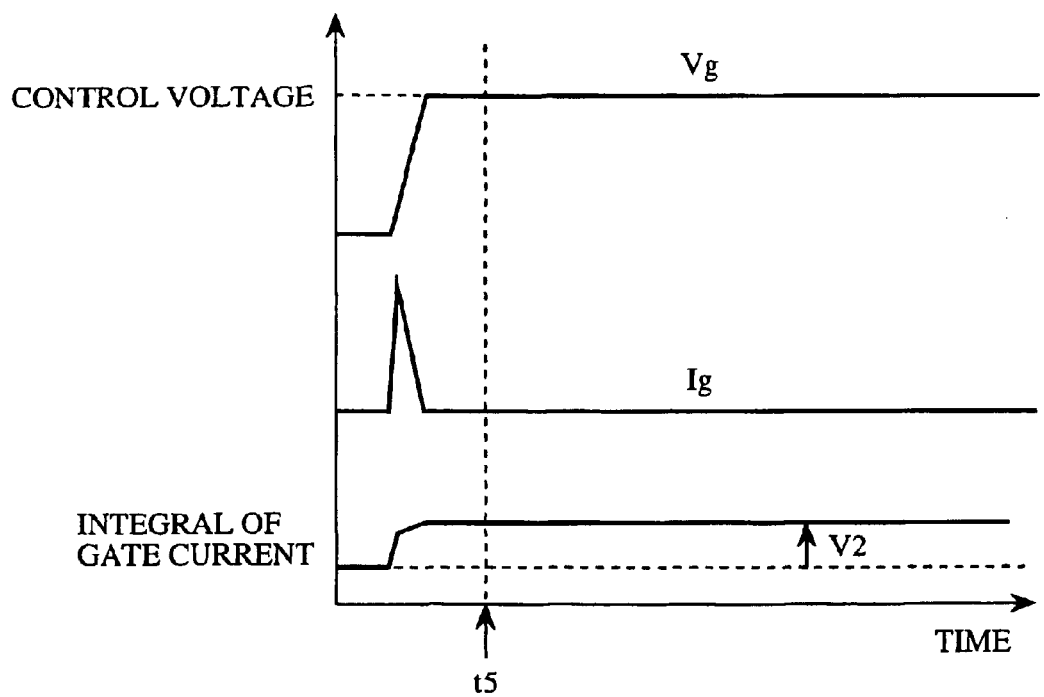
FIG. 22 is an explanatory drawing for showing the waveforms of the gate voltage, the gate current, and the integral (i.e., the amount of charge) when the power semiconductor device is turned with the power semiconductor device short-circuited.

FIG. 21 is an explanatory drawing showing the waveforms of the gate voltage Vg, the gate current Ig, and the integral of the gate current Ig (i.e., the amount of gate charge) when the IGBT 11 is turned on under normal operating conditions, and FIG. 22 is an explanatory drawing showing the waveforms of the gate voltage Vg, the gate current Ig, and the integral of the gate current Ig (i.e., the amount of gate charge) when the IGBT 11 is turned on with the IGBT short-circuited. As explained in above-mentioned embodiment 1, a Miller time period appears when the IGBT 11 is turned on under normal operating conditions, and a collector-emitter voltage Vce decreases and a feedback capacitance increases during the Miller time period. A lot of electric charges are therefore supplied from a controllable power source to the IGBT 11, and the integral of the gate current Ig reaches V1. On the other hand, because there is no Miller time period and the quantity of charge supplied from the controllable power source is small when a short circuit occurs in the IGBT 11, the integral of the gate current Ig becomes V2 and is smaller than the integral V1 obtained when the IGBT is turned on under normal operating conditions. It is therefore possible to detect the occurrence of a short circuit by detecting the difference in the integral of the gate current Ig between when the IGBT is turned on under normal operating conditions and when a short circuit occurs in the IGBT 11.

In accordance with this embodiment 10, the gate charge detector 19 detects the integral of the gate current Ig supplied to the gate terminal of the IGBT 11 throughout the detection time period during which the sampler 16 allows the detection process of detecting the integral of the gate current Ig, and, when the integral of the gate current Ig is equal to or smaller than a reference value, delivers an abnormality signal to a control logic 12.

Concretely, the sampler 16 instructs the gate charge detector 19 to determine the integral of the gate current Ig when the integral of the gate current Ig exceeds the reference value under normal operating conditions, that is, after a time t5, as shown in FIGS. 21 and 22. The integrating circuit of the gate charge detector 19 performs an integration process of integrating the gate current Ig, and, when receiving the instruction for determining the integral of the gate current Ig from the sampler 16 after the time t5, delivers the integral of the gate current Ig which has been obtained until now as the determined integral value. The integrating circuit has a reset circuit for resetting the integral value to zero by the time when the IGBT is turned on next.

The comparison circuit of the gate charge detector 19 compares the integral value delivered from the integrating circuit with the reference value, and, when the integral value is equal to or smaller than the reference value, delivers an abnormality signal to the control logic 12. The reference value can be so set as to take on values from the integral value V2 to the integral value V1 in advance. The drive circuit in accordance with this embodiment 10 can thus protect the IGBT 11 with higher reliability by promptly detecting the occurrence of a short circuit even when the IGBT 11 is resistant to high voltages, like that of above-mentioned embodiment 1.

Embodiment 11.

Figure 23:
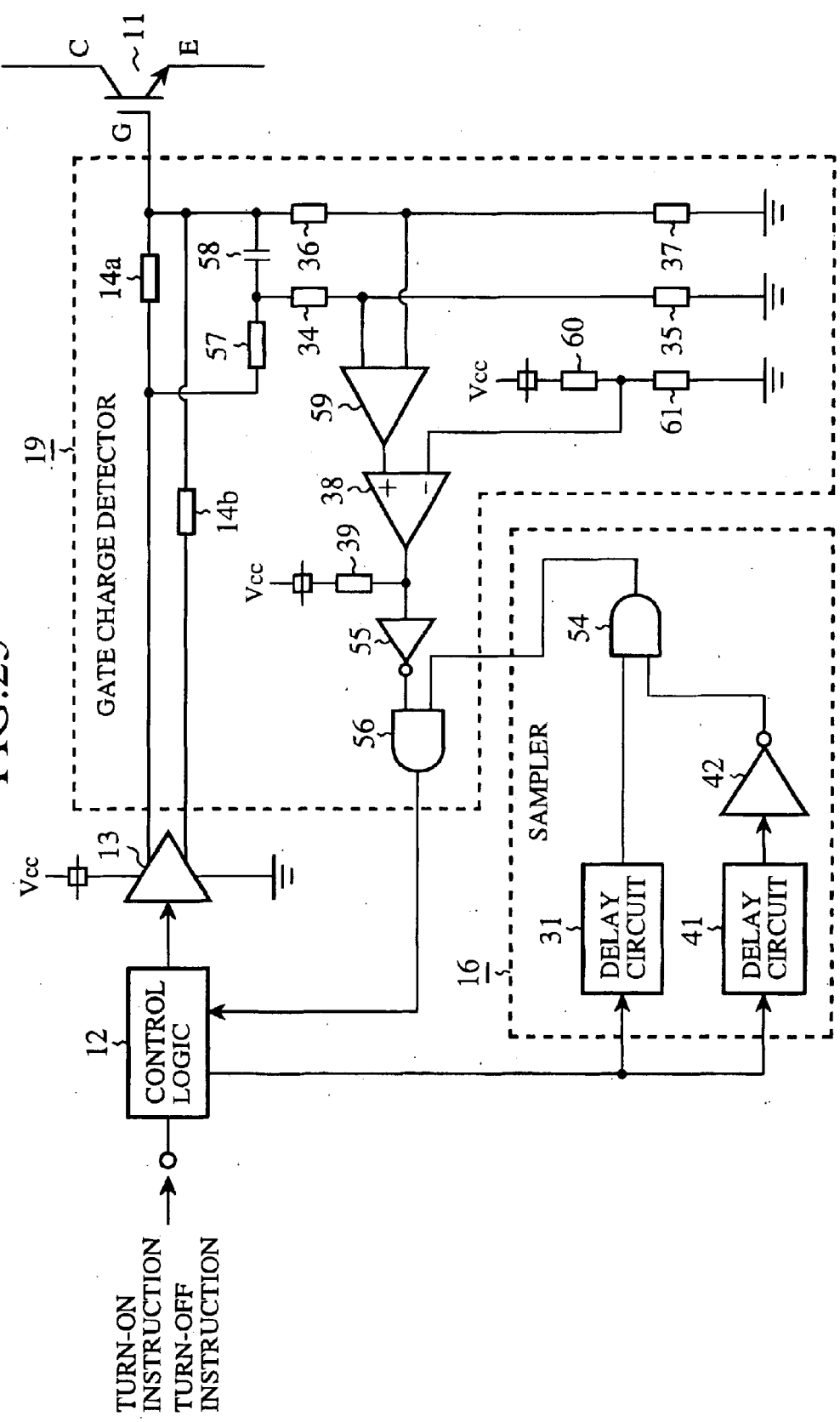
FIG. 23 is a block diagram showing the structure of a drive circuit for driving a power semiconductor device according to embodiment 11 of the present invention.
Figure 24:
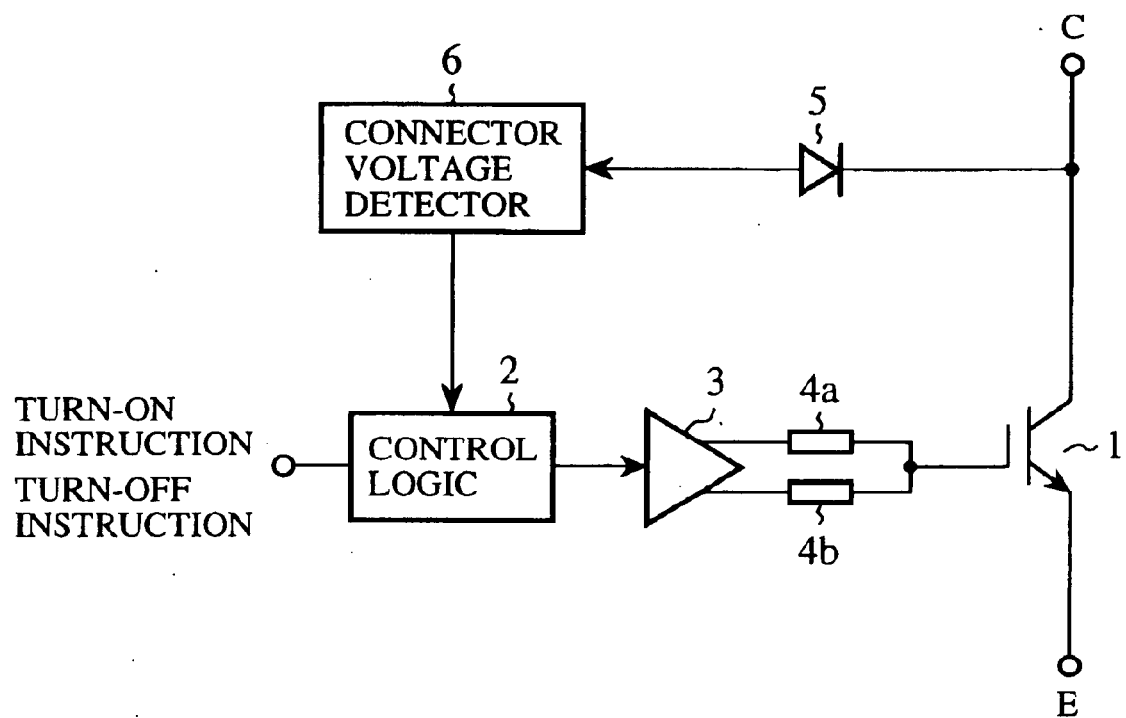
FIG. 24 is a block diagram showing the structure of the structure of a prior art drive circuit for driving a power semiconductor device.

FIG. 23 is a block diagram showing the structure of a drive circuit for driving a power semiconductor device in accordance with embodiment 11 of the present invention. In the figure, because the same reference numerals as shown in FIG. 19 denote the same components as those of the ninth embodiment or like components, the explanation of those components will be omitted hereafter. FIG. 23 shows a concrete example of a sampler 16 and a gate charge detector 19 of FIG. 20. In the figure, a turn-off speed control circuit 15 is omitted, and reference numeral 57 denotes a resistor and reference numeral 58 denotes a capacitor. A CR circuit that consists of the resistor 57 and the capacitor 58 integrates a gate current Ig flowing in an IGBT. Reference numeral 59 denotes, a differential amplifier for receiving a divided voltage obtained by dividing resistors 34 and 35 and a divided voltage obtained by dividing resistors 36 and 37, and for amplifying the difference between those divided voltages, and reference numerals 60 and 61 denote dividing resistors for dividing a control voltage Vcc and for furnishing a divided voltage (i.e., a reference voltage) to a comparator 38.

Next, a description will be made as to an operation of the drive circuit for driving a power semiconductor device in accordance with embodiment 11. After a time t5 when the integral of the gate current Ig exceeds a reference value under normal operating conditions, the sampler 16 delivers a signal at a High level to an AND circuit 56 in order for the gate charge detector 19 to determine the integral of the gate current Ig. The signal output from the sampler 16 is made to change to a High level at once immediately after the time t5 in order to prevent the IGBT 11 from being destroyed.

Because the differential amplifier 59 outputs a voltage that exceeds the reference voltage applied to the comparator 38 (i.e., the one delivered from the dividing resistors 60 and 61) under normal operating conditions after the time t5, the output signal of the comparator 38 becomes a High level and a signal at a Low level is delivered from an inverter 55 to the AND circuit 56. Therefore, the AND circuit 56 sends out a signal at a Low level under normal operating conditions.

On the other hand, because the voltage delivered from the differential amplifier 59 doesn't exceed the reference voltage applied to the comparator 38 even after the time t5 when a short circuit occurs in the IGBT 11, the output signal of the comparator 38 becomes a Low level and a signal at a High level is delivered from the inverter 55 to the AND circuit 56. Therefore, when a short circuit occurs in the IGBT 11, the AND circuit 56 sends out a signal at a High level (indicating the detection of an abnormality).

In accordance with this embodiment 11, because the drive circuit can prevent the gate charge detector 19 from malfunctioning under normal operating conditions, the reliability of the drive circuit for driving a power semiconductor device can be improved. In addition, the drive circuit can integrate the gate current Ig by using an integrating circuit equipped with an OP amplifier, instead of the CR circuit consisting of the resistor 57 and the capacitor 58.

Many widely different embodiments of the present invention may be constructed without departing from the spirit and scope of the present invention. It should be understood that the present invention is not limited to the specific embodiments described in the specification, except as defined in the appended claims.

What is claimed is:

1. A drive circuit for driving a power semiconductor device, said circuit comprising:
   control means for controlling switching of the power semiconductor device according to a turn-on instruction or turn-off instruction sent to the power semiconductor device from outside said drive circuit; and
   abnormality detection means for detecting value of at least one of a voltage that appears at a control terminal of the power semiconductor device and a current that flows into the control terminal of the power semiconductor device, and for detecting occurrence of an abnormality in the power semiconductor device when the value detected reaches an on-state value within a time period after receiving a turn-on instruction, the time period being shorter than a normal time period that elapses when the value detected reaches the on-state value after receiving a turn-on instruction in absence of an abnormality in the power semiconductor device.

2. The drive circuit according to claim 1, wherein said abnormality detection means detects the voltage that appears at the control terminal of the power semiconductor device during a first time period from receiving the turn-on instruction and detects occurrence of an abnormality in the power semiconductor device when the voltage detected reaches the on-state value within the first time period, the first time period excluding the normal time period during which, in the absence of an abnormality in the power semiconductor device, the voltage that appears at the control terminal of the power semiconductor device becomes equal to the on-state value.

3. The drive circuit according to claim 2, wherein said abnormality detection means detects the current that flows into the control terminal of the power semiconductor device during a first time period from receiving the turn-on instruction and detects occurrence of an abnormality in the power semiconductor device when the current detected reaches the on-state value within the first time period, the first time period excluding the normal time period during which, in the absence of an abnormality in the power semiconductor device the control current that flows into the control terminal of the power semiconductor device becomes equal to the on-state value.

4. A drive circuit for driving a power semiconductor device, said circuit comprising:
control means for controlling switching of the power semiconductor device according to a turn-on instruction or turn-off instruction sent to the power semiconductor device from outside said drive circuit; and
abnormality detection means for detecting value of at least one of a control voltage that appears at a control terminal of the power semiconductor device and a control current that flows into the control terminal of the power semiconductor device, and for detecting occurrence of an abnormality in the power semiconductor device when the value detected reaches an on-state value of the control voltage or the control current, wherein said abnormality detection means validates detection of the occurrence of an abnormality in the power semiconductor device only during a time period after receiving a turn-on instruction, the time period excluding a normal time period during which, in absence of an abnormality in the power semiconductor device, the control voltage that appears at the control terminal of the power semiconductor device or the control current that flows into the control terminal of the power semiconductor device becomes equal to the on-state value of the control voltage or the control current.

5. The drive circuit according to claim 1, wherein, when said abnormality detection means detects the occurrence of an abnormality in the power semiconductor device, said control means causes the power semiconductor device to make a transition to an off state.

6. The drive circuit according to claim 1, wherein, when said abnormality detection means detects the occurrence of an abnormality in the power semiconductor device, said control means causes the power semiconductor device to make a transition to an off state at a lower speed than the speed at which said control means causes the power semiconductor device to make a transition to an off state according to a turn-off instruction.

7. The drive circuit according to claim 2, wherein the first time period excludes a recovery time period immediately following beginning of turning-on of the power semiconductor device.

8. The drive circuit according to claim 3, wherein the first time period excludes a recovery time period immediately following beginning of turning-on of the power semiconductor device.

9. The drive circuit according to claim 4, wherein the first time period excludes a recovery time period immediately following beginning of turning-on of the power semiconductor device.

10. The drive circuit according to claim 4, wherein, when said abnormality detection means detects the occurrence of an abnormality in the power semiconductor device, said control means causes the power semiconductor device to make a transition to an off state.

11. The drive circuit according to claim 4, wherein, when said abnormality detection means detects the occurrence of an abnormality in the power semiconductor device, said control means causes the power semiconductor device to make a transition to an off state at a lower speed than the speed at which said control means causes the power semiconductor device to make a transition to an off state according to a turn-off instruction.

12. A drive circuit for driving a power semiconductor device, said circuit comprising:
control means for controlling switching of the power semiconductor device according to a turn-on instruction or turn-off instruction sent to the power semiconductor device from outside said drive circuit; and
abnormality detection means for detecting amount of charge supplied to a control terminal of the power semiconductor device during a time period after receiving the turn-on instruction, and for detecting occurrence of an abnormality in the power semiconductor device when, after lapse of the time period, the amount of charge detected is less than a reference value, the reference value being larger than a total amount of charge supplied to the control terminal of the power semiconductor device during turning-on of the power semiconductor device when an abnormality occurs in the power semiconductor device, wherein the time period is longer than a normal time period during which, in absence of an abnormality in the power semiconductor device, the total amount of charge supplied to the control terminal of the power semiconductor device reaches the reference value.

13. The drive circuit according to claim 12, wherein, when said abnormality detection means detects the occurrence of an abnormality in the power semiconductor device, said control means causes the power semiconductor device to make a transition to an off state.

14. The drive circuit according to claim 12, wherein, when said abnormality detection means detects the occurrence of an abnormality in the power semiconductor device, said control means causes the power semiconductor device to make a transition to an off state at a lower speed than the speed at which said control means causes the power semiconductor device to make a transition to an off state according to a turn-off instruction.

* * * * *